(12) United States Patent
Heo et al.

(10) Patent No.: US 12,432,289 B2
(45) Date of Patent: Sep. 30, 2025

(54) ELECTRONIC DEVICE INCLUDING ANTENNA AND METHOD THEREOF

(71) Applicant: Samsung Electronics Co., Ltd., Suwon-si (KR)

(72) Inventors: Wonhyung Heo, Suwon-si (KR); Taeho Kim, Suwon-si (KR); Dongil Son, Suwon-si (KR); Choongsun Shim, Suwon-si (KR); Sanghyun Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 495 days.

(21) Appl. No.: 18/077,609

(22) Filed: Dec. 8, 2022

(65) Prior Publication Data

US 2023/0126224 A1    Apr. 27, 2023

Related U.S. Application Data

(63) Continuation of application No. PCT/KR2022/016498, filed on Oct. 26, 2022.

(30) Foreign Application Priority Data

Oct. 26, 2021 (KR) ................. 10-2021-0143913

(51) Int. Cl.
*H04M 1/02* (2006.01)
*H01Q 1/24* (2006.01)
*H03H 7/38* (2006.01)

(52) U.S. Cl.
CPC .......... *H04M 1/0245* (2013.01); *H01Q 1/243* (2013.01); *H03H 7/38* (2013.01); *H04M 1/0216* (2013.01); *H04M 1/0237* (2013.01)

(58) Field of Classification Search
CPC ............ H04M 1/0245; H04M 1/0216; H04M 1/0237; H04M 1/0241; H04M 1/0243;
(Continued)

(56) References Cited

U.S. PATENT DOCUMENTS 7,983,626 B2    7/2011   Kim
8,457,697 B2    6/2013   Johansson et al.
(Continued)

FOREIGN PATENT DOCUMENTS

JP    2007-043410 A    2/2007
JP    5264372 B2       8/2013
(Continued)

OTHER PUBLICATIONS

International Search Report with English translation dated Feb. 2, 2023; International Application No. PCT/KR2022/016498.

*Primary Examiner* — Dhaval V Patel
(74) *Attorney, Agent, or Firm* — Jefferson IP Law, LLP

(57) ABSTRACT

An electronic device is provided. The electronic device includes a housing structure including a first housing and a second housing connected to first housing, the second housing being connected to the first housing so as to be slidable while being at least partially inserted into or withdrawn from the first housing, a sensor module including at least one sensor, an antenna, an antenna tuner electrically connected to the antenna and configured to match impedance of the antenna, and a processor operatively connected to the sensor module, the antenna, and the antenna tuner, wherein the processor is configured to determine withdrawal information about a withdrawn degree of the second housing by using the sensor module, select an index corresponding to the withdrawal information from among multiple indices in which impedance values of the antenna according to multiple different pieces of withdrawal information are sampled, and control, based on a tuning code corresponding to the selected (Continued)

index, the antenna tuner to activate or deactivate at least some among at least one of one or more capacitors or one or more inductors included in the antenna tuner, so as to match the impedance of the antenna.

24 Claims, 15 Drawing Sheets

(58) Field of Classification Search
CPC ..... H04M 1/0235; H01Q 1/243; H01Q 5/335; H01Q 21/28; H03H 7/38; H03H 7/40
See application file for complete search history.

(56) References Cited

U.S. PATENT DOCUMENTS

| | | | |
|---|---|---|---|
| 8,768,421 | B2 | 7/2014 | Hung et al. |
| 9,774,362 | B1* | 9/2017 | Sammeta ................. H04B 1/40 |
| 10,903,570 | B2 | 1/2021 | Kim et al. |
| 11,184,040 | B2 | 11/2021 | Park et al. |
| 2004/0242289 | A1 | 12/2004 | Jellicoe et al. |
| 2005/0096081 | A1 | 5/2005 | Black et al. |
| 2007/0194859 | A1* | 8/2007 | Brobston ................. H03H 7/40 333/17.3 |
| 2012/0009983 | A1 | 1/2012 | Mow et al. |
| 2013/0271342 | A1* | 10/2013 | Shen ........................ H04B 1/18 343/861 |
| 2014/0051375 | A1* | 2/2014 | Hung ....................... H04B 1/16 455/193.1 |
| 2018/0026369 | A1* | 1/2018 | Kim ........................ H04B 17/12 343/850 |

FOREIGN PATENT DOCUMENTS

| | | |
|---|---|---|
| JP | 5813133 B2 | 11/2015 |
| KR | 10-2005-0022977 A | 3/2005 |
| KR | 10-2006-0023541 A | 3/2006 |
| KR | 10-2006-0111460 A | 10/2006 |
| KR | 10-2006-0135356 A | 12/2006 |
| KR | 10-2012-0004338 A | 1/2012 |
| KR | 10-2020-0097475 A | 8/2020 |
| KR | 10-2021-0034990 A | 3/2021 |

* cited by examiner

FIG. 7
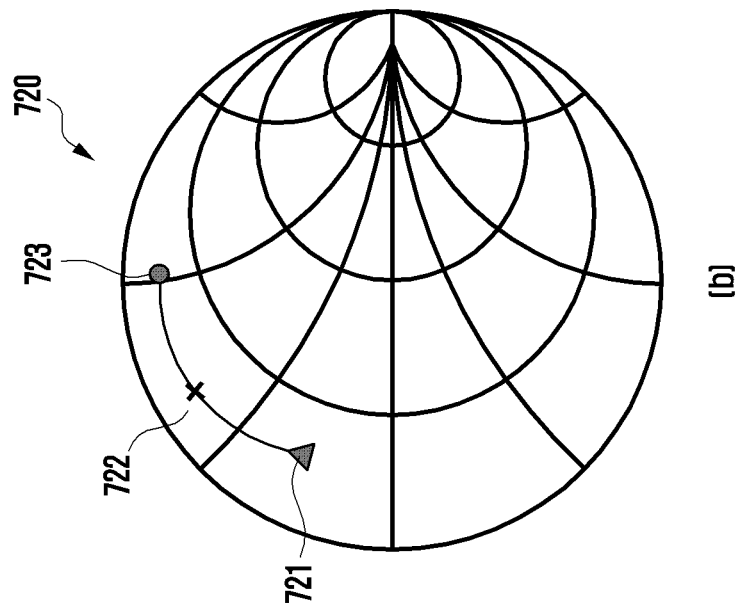
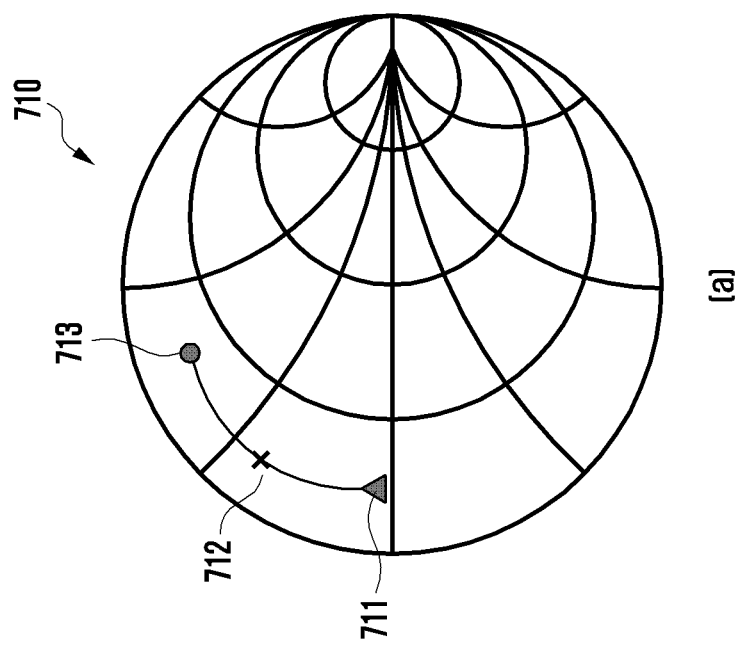

FIG. 8
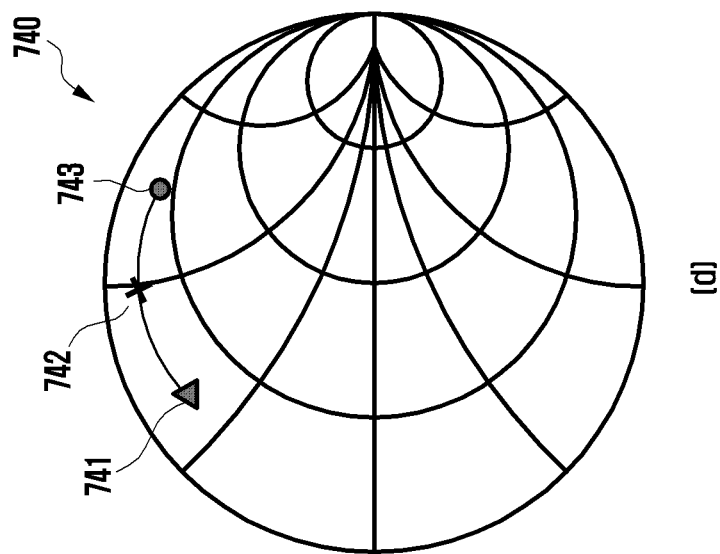
[d]
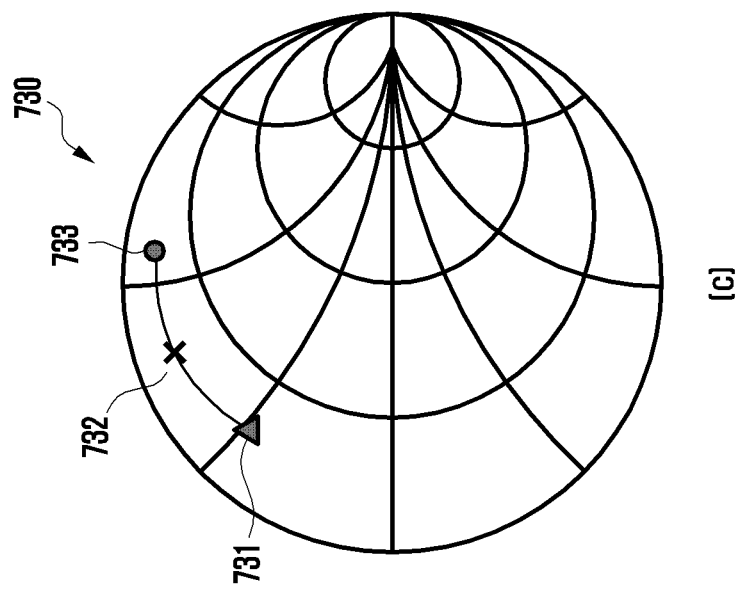
[c]

FIG. 9
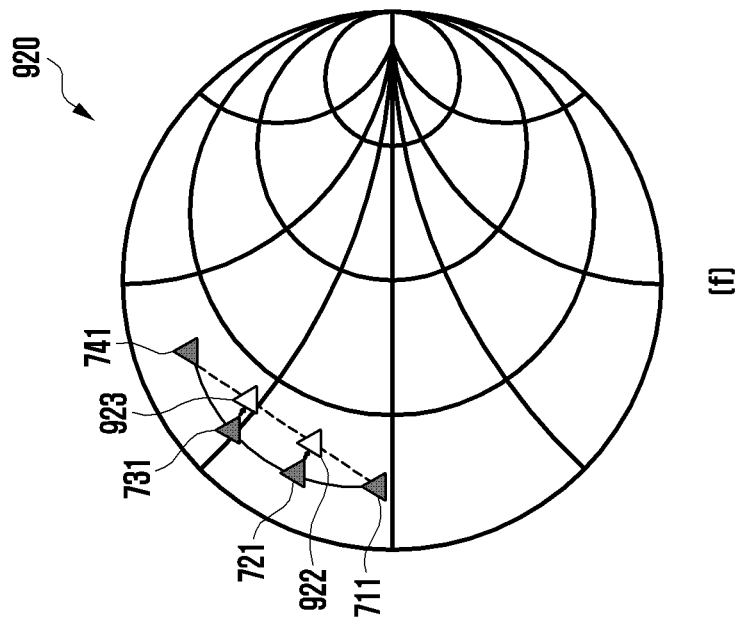
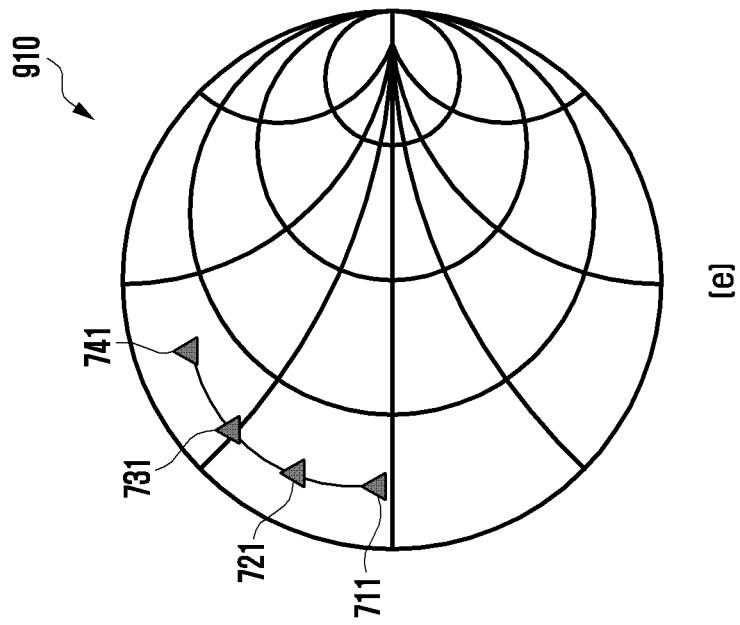

ELECTRONIC DEVICE INCLUDING ANTENNA AND METHOD THEREOF

CROSS-REFERENCE TO RELATED APPLICATION(S)

This application is a continuation application, claiming priority under § 365(c), of an International application No. PCT/KR2022/016498, filed on Oct. 26, 2022, which is based on and claims the benefit of a Korean patent application number 10-2021-0143913, filed on Oct. 26, 2021, in the Korean Intellectual Property Office, the disclosure of which is incorporated by reference herein in its entirety.

TECHNICAL FIELD

The disclosure relates to an electronic device. More particularly, the disclosure relates to a method in which an electronic device including at least one antenna controls the antenna.

BACKGROUND ART

An electronic device may wirelessly communicate with an external electronic device by using at least one antenna. The impedance of the antenna may affect the transmission efficiency of the antenna for wireless communication. For example, if the electronic device has a difference in impedance between the antenna and the front-end module for transmitting signals to the antenna, at least a part of a transmitted signal may be reflected without being emitted (reflection loss).

The electronic device may match the impedance of the antenna to improve the transmission efficiency of the antenna. For example, the impedance matching may refer to an operation for matching the antenna impedance, which changes depending on various radio-wave environments or electronic device use environments with a characteristic impedance such that the maximum power transfer transmission is possible with the antenna.

In line with development of display technologies, there have been extensive research and development regarding electronic devices having flexible displays. Electronic devices are evolving from unilateral quadrangular shapes to more diversified shapes. For example, research and development have been conducted such that, by applying flexible displays, electronic devices have form factors in which they can be folded, bent, rolled, or unfolded.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

Electronic devices may include foldable type electronic devices having displays that can be folded or unfolded (hereinafter, referred to as "foldable electronic devices") or rollable type electronic devices having displays that can be wound or expanded (hereinafter, referred to as "rollable electronic devices"). A foldable or rollable electronic device may include first and second housings that may be coupled such that they can move with regard to each other, and a housing structure including the first and second housings may have a shape that is variable depending on use of the electronic device.

The antenna impedance of a foldable or rollable electronic device may vary as the housing shape changes. Therefore, impedance matching may be performed by considering various shapes that the electronic device may have. For example, if at least a part of the first or second housing of the electronic device is used as an antenna, the antenna impedance may change, depending on various shapes that the electronic device may have, thereby degrading the antenna performance.

Aspects of the disclosure are to address at least the above-mentioned problems and/or disadvantages and to provide at least the advantages described below. Accordingly, an aspect of the disclosure is to provide an electronic device and a method for stably maintaining the performance of an antenna in response to a change in the shape of a housing, and a device therefor.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a housing structure including a first housing and a second housing connected to the first housing, the second housing being connected to the first housing so as to be slidable while being at least partially inserted into or withdrawn from the first housing, a sensor module including at least one sensor, an antenna, an antenna tuner electrically connected to the antenna and configured to match impedance of the antenna, and a processor operatively connected to the sensor module, the antenna, and the antenna tuner, wherein the processor is configured to determine withdrawal information about a withdrawn degree of the second housing by using the sensor module, select an index corresponding to the withdrawal information from among multiple indices in which impedance values of the antenna according to multiple different pieces of withdrawal information are sampled, and control, based on a tuning code corresponding to the selected index, the antenna tuner to activate or deactivate at least some among at least one of one or more capacitors or one or more inductors included in the antenna tuner, so as to match the impedance of the antenna.

In accordance with another aspect of the disclosure, an electronic device is provided. The electronic device includes a housing structure including a hinge part, a first housing, and a second housing connected to the first housing through the hinge part, the first housing and the second housing being connected to each other so as to be folded or unfolded with reference to the housing, a sensor module including at least one sensor, an antenna, an antenna tuner electrically connected to the antenna and configured to match impedance of the antenna, and a processor operatively connected to the sensor module, the antenna, and the antenna tuner, wherein the processor is configured to determine, using the sensor module, folding information about a degree by which the first housing and the second housing are folded, select an index corresponding to the folding information from among multiple indices in which impedance values of the antenna according to multiple different pieces of folding information are sampled, and control, based on a tuning code corresponding to the selected index, the antenna tuner to activate or deactivate at least some among at least one of one or more capacitors or one or more inductors included in the antenna tuner, so as to match the impedance of the antenna.

In accordance with another aspect of the disclosure, a method performed by an electronic device including a first housing and a second housing connected to the first housing so as to be at least partially insertable into or withdrawable from the first housing is provided. The method includes determining withdrawal information about a withdrawn degree of the second housing, selecting an index corresponding to the withdrawal information from among multiple indices in which impedance values of an antenna of the electronic device according to multiple different pieces of withdrawal information are sampled, and controlling, based on a tuning code corresponding to the selected index, an antenna tuner to activate or deactivate at least some among at least one of one or more capacitors or one or more inductors included in the antenna tuner, so as to match impedance of the antenna.

In accordance with another aspect of the disclosure, a method performed by an electronic device including a first housing and a second housing connected to each other so as to be folded or unfolded is provided. The method includes determining folding information about a degree by which the first housing and the second housing are folded, selecting an index corresponding to the folding information from among multiple indices in which impedance values of an antenna of the electronic device are sampled according to multiple different pieces of folding information, and controlling, based on a tuning code corresponding to the selected index, an antenna tuner to activate or deactivate at least some among at least one of one or more capacitors or one or more inductors included in the antenna tuner, so as to match impedance of the antenna.

Advantageous Effects of Invention

According to various embodiments, antenna impedance matching may be performed in response to a shape that varies as a foldable or rollable electronic device is used such that, even if the shape of the electronic device changes, the antenna performance can be maintained stably.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which:

FIGS. 7 and 8 are impedance graphs based on the frequency and folding angle of a foldable electronic device according to various embodiments of the disclosure;

FIG. 9 is an impedance graph based on the folding angle of a foldable electronic device according to an embodiment of the disclosure;

The same reference numerals are used to represent the same elements throughout the drawings.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
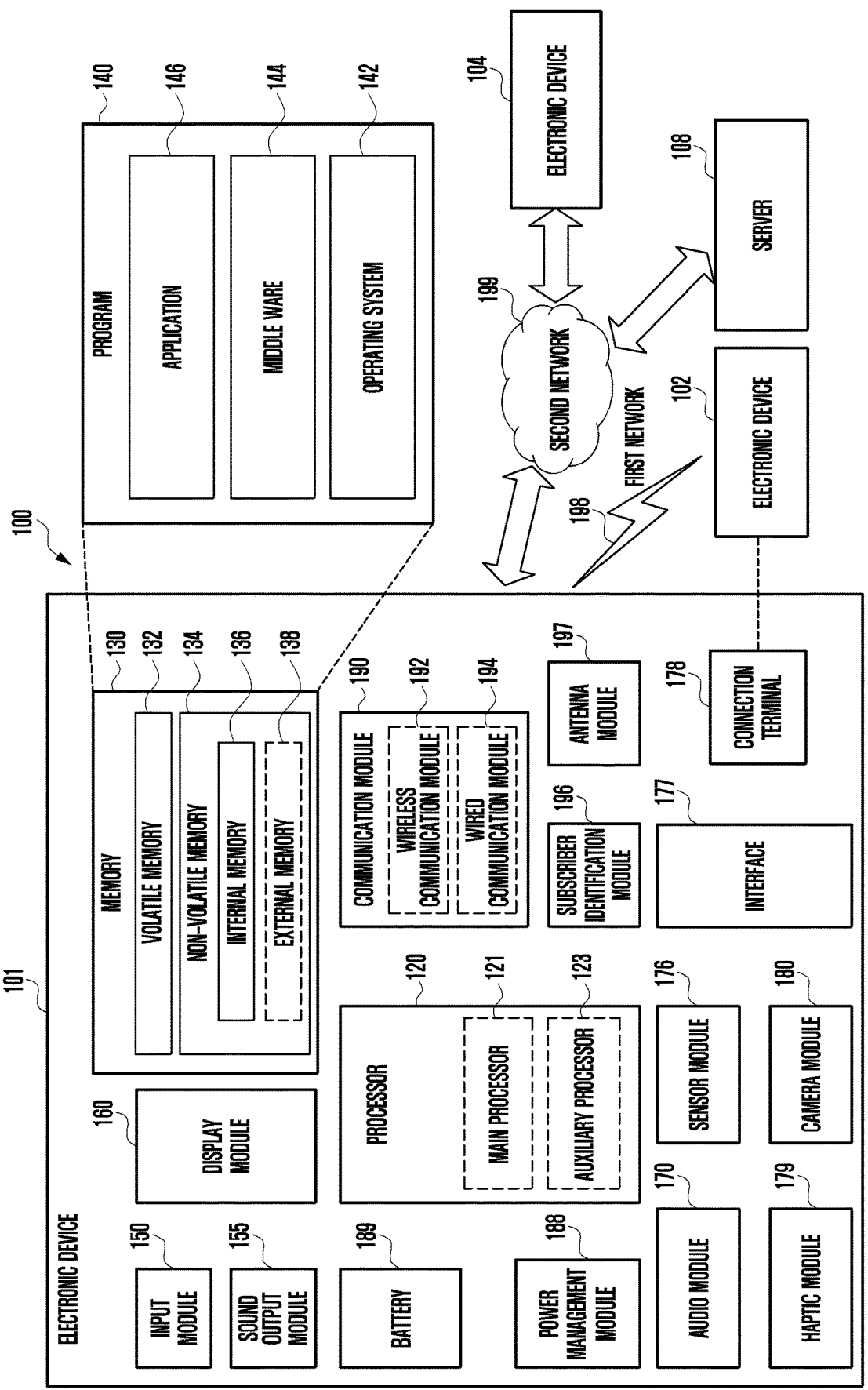
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly.

According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
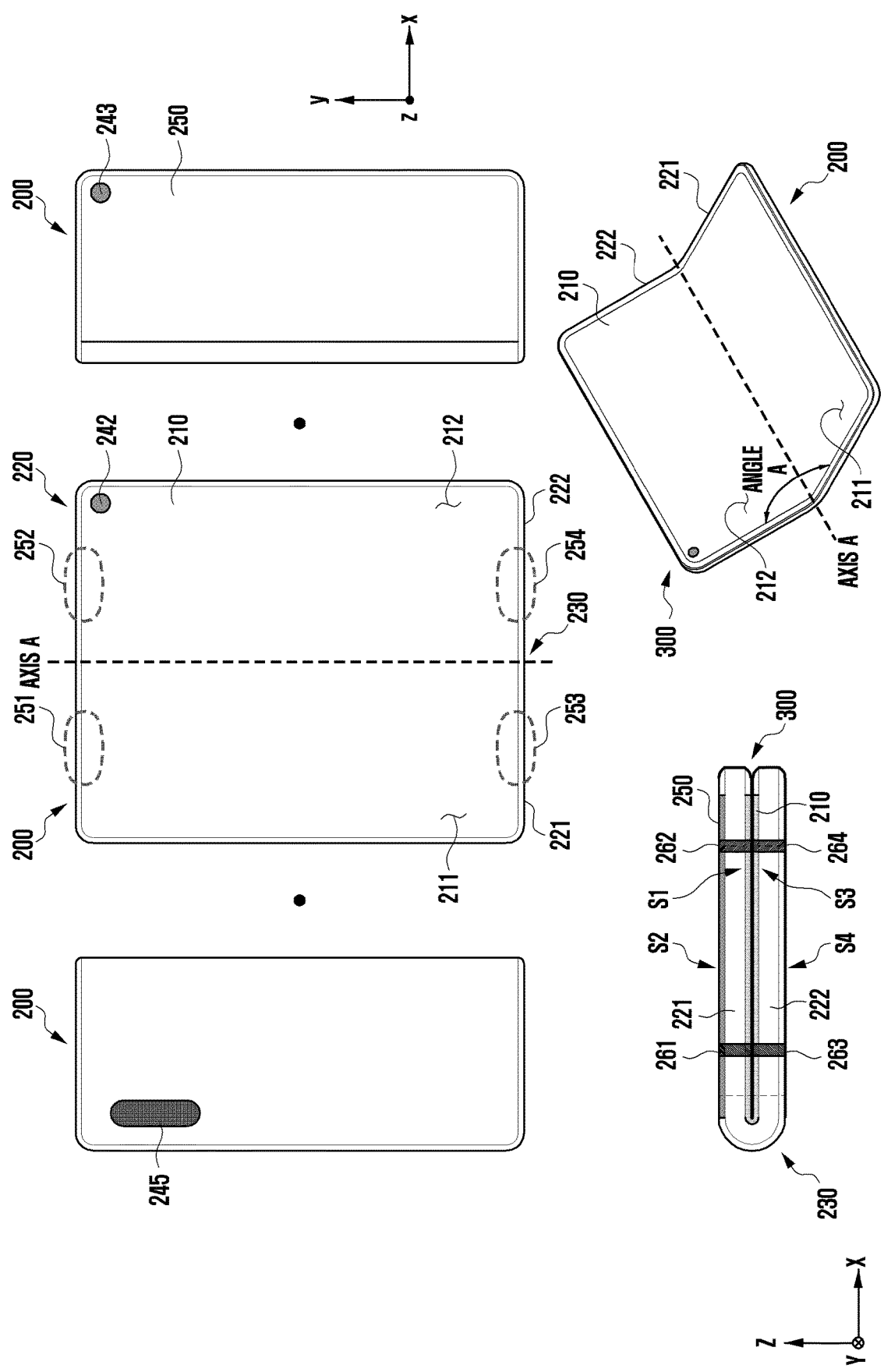
FIG. 2 is an illustration showing a structure and a state change of an electronic device including a flexible display according to an embodiment of the disclosure.

FIG. 2 is an illustration showing a structure and a state change of an electronic device including a flexible display according to an embodiment of the disclosure.

Referring to FIG. 2, an electronic device 200 (e.g., the electronic device 101 in FIG. 1) including a flexible display (e.g., a first display 210) according to various embodiments may be a foldable electronic device. According to various embodiments, the electronic device 200 may include a first housing 221, a second housing 222, and/or a hinge part 230, forming a housing structure 220 of the electronic device 200. For example, the first housing 221 may include a first surface S1 and a second surface S2, and the second housing 222 may include a third surface S3 and a fourth surface S4. For example, when the first display 210 of the electronic device 200 is folded with reference to axis A, the first surface S1 of the first housing 221 may be placed on the third surface S3 of the second housing 222 while facing the third surface S3. When the electronic device 200 is in a folded state, for example, an angle (e.g., angle A) formed by the first surface S1 of the first housing 221 and the third surface S3 of the second housing 222 may be a narrow angle (e.g., 0 to 5 degrees). The folded state may be a close state or a closed state, and may be a state in which the electronic device 200 is completely folded. The first display 210 may be divided into a first region 211 and a second region 212 that are regions into which first display 210 is divided by being physically folded. The first region may be positioned on the first surface S1 of the first housing 221, and the second region may be positioned on the third surface S3 of the second housing 222. The first housing 221 and the second housing 222 may be disposed at both sides with reference to a folding axis (e.g., axis A), respectively, and may have shapes which are overall symmetrical with respect to the folding axis.

According to various embodiments, the hinge part 230 may be disposed between the first housing 221 and the second housing 222, and thus the first housing 221 and the second housing 222 of the electronic device 200 may be folded and placed on each other. According to an embodiment, the first housing 221 and the second housing 222 may be connected to each other through the hinge part 230. However, the housing structure of the electronic device, in which housings are disposed at left and right sides with reference to the folding axis (e.g., axis A) may be merely one example, and, as described later, may have housing housings disposed at upper and lower sides with reference to the folding axis of the electronic device as in FIG. 3. According to an embodiment, the hinge part 230 may be disposed along axis A.

According to various embodiments, the shape of the housing structure 220 of the electronic device 200 may vary. For example, with reference to the hinge part 230, the first housing 221 and the second housing 222 may move by being unfolded or folded. According to an embodiment, the first housing 221 and the second housing 222 may form a folding angle (e.g., angle A). According to various embodiments, the folding angle (e.g., angle A) may be changed. For example, angle A may have a size of about 0 to about 180 degrees. In another example, angle A may have a size of about 0 to about 360 degrees. The angle (e.g., angle A) or distance formed between the first housing 221 and the second housing 222 may vary depending on whether the state of the electronic device 200 is an unfolded state (or opened state), a folded state (or a closed state), or an intermediate state. For example, the unfolded state may be an open state, a flat state, or an opened state. A state in which the first display 210 of the electronic device 200 is unfolded is a state in which the first housing 221 and the second housing 222 are disposed side by side, and may be a state in which the electronic device 200 is completely unfolded. The state in which the first display 210 is unfolded may be a state in which angle A is about 180 degrees. While the electronic device 200 is in the unfolded state, the first surface S1 of the first housing 221 and the third surface S3 of the second housing 222 may be disposed to face a substantially identical direction.

The intermediate state, among the states of the first display of the electronic device 200, may be a state in which the first housing 221 and the second housing 222 are disposed with a predetermined angle therebetween, may be an intermediate state between the folded state and the unfolded state. For example, the intermediate state may be a state in which angle A forms a predetermined angle (e.g., about 6 to about 179 degrees).

According to an embodiment, the electronic device may include a second display 250 (e.g., the display module 160 in FIG. 1) on at least a part of the first housing 221 or the second housing 222. Referring to FIG. 2, the second display 250 may be disposed on at least a part of the second surface S2 of the first housing 221 of the electronic device 200. In another example, the second display 250 may be disposed on the fourth surface S4 of the second housing 222, and may be formed in a partial region or a substantially entire region of the second surface S2 of the first housing 221 and the fourth surface S4 of the second housing 222. The second display 250 may include at least some of the structure and/or functions of the display module 160 in FIG. 1.

According to various embodiments, although not illustrated, the electronic device 200 may include a sensor module, and may include camera modules 242, 243, and 245.

According to an embodiment, the sensor module may be disposed under the display 210 (e.g., in the −Z direction from the display 210), and may detect an external environment, based on information (e.g., light) received through the display 210. According to an embodiment, the sensor module may include at least one among a receiver, a proximity sensor, an ultrasonic sensor, a gesture sensor, a gyro sensor, a barometric pressure sensor, a magnetic sensor, an acceleration sensor, a grip sensor, a color sensor, an infrared (IR) sensor, a biosensor, a temperature sensor, or a humidity sensor. According to an embodiment, at least some sensor modules of the electronic device 200 may be visually exposed outside through a partial region of the display 210. According to an embodiment, the electronic device 200 may detect a folding angle (e.g., angle A) by using the sensor module.

According to an embodiment, the electronic device 200 may include at least one of each sensor (e.g., the acceleration sensor, the gyro sensor, and/or the magnetic sensor) in multiple housings (e.g., the first housing 221 and/or the second housing 222). In another example, the electronic device 200 may include each sensor (e.g., the acceleration sensor, the gyro sensor, and/or the magnetic sensor) in only one of the multiple housings (e.g., the first housing 221 and/or the second housing 222).

According to various embodiments, the electronic device 200 may include at least one antenna. The at least one antenna may receive a communication signal outside the electronic device 200. According to an embodiment, the at least one antenna may be disposed in partial regions (e.g., a first antenna region 251, a second antenna region 252, a third antenna region 253, and a fourth antenna region 254) of end parts of housings (e.g., the first housing 221 and the second housing 222) of the electronic device 200. According to an embodiment, the at least one antenna may be disposed toward the outside of the electronic device 200, and may include segment parts (e.g., a first antenna segment 261, a second antenna segment 262, a third antenna segment 263, and a fourth antenna segment 264) containing a conductive material.

Figure 3:
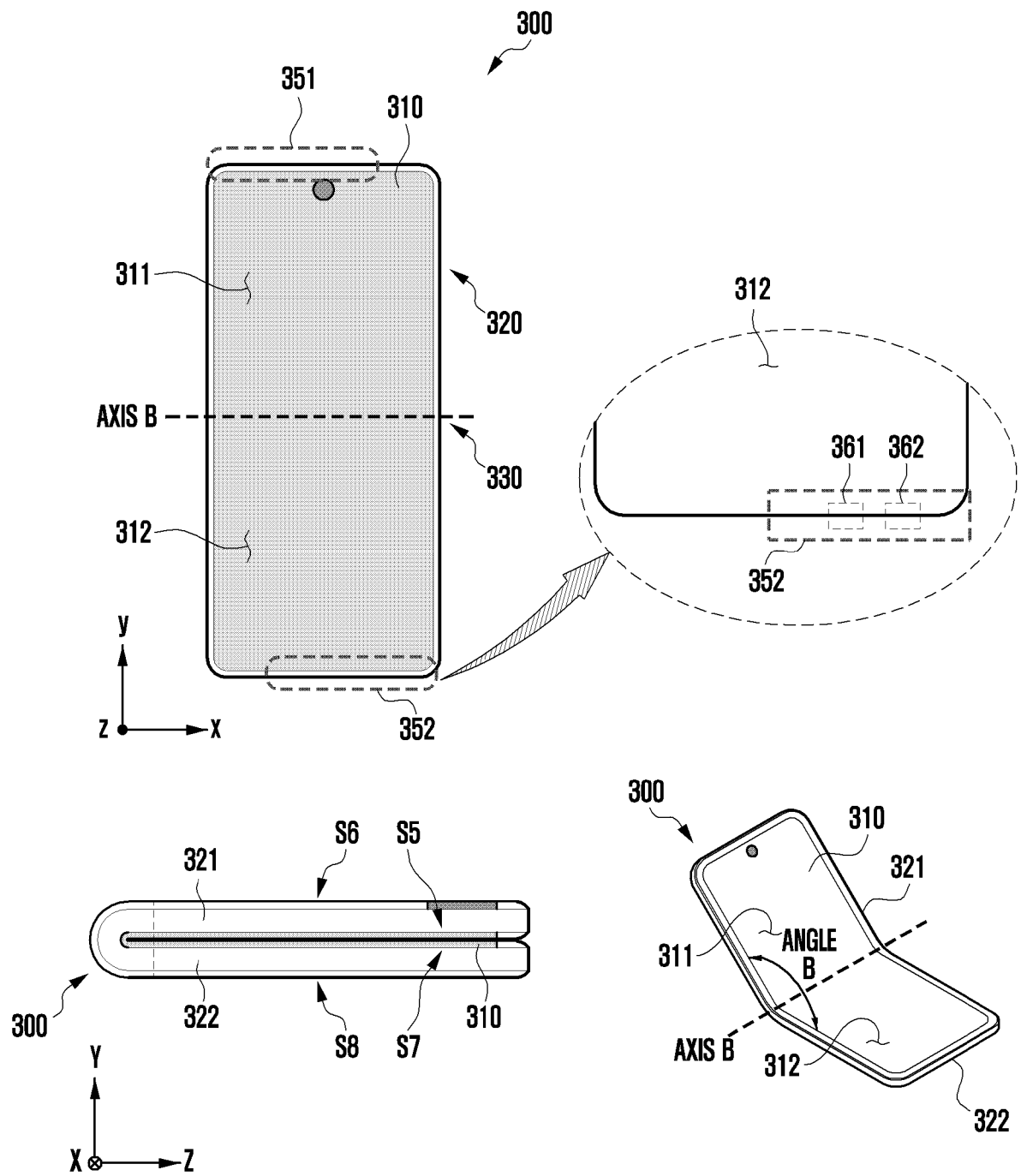
FIG. 3 is an illustration showing a structure and a state change of an electronic device including a flexible display according to an embodiment of the disclosure.

FIG. 3 is an illustration showing a structure and a state change of an electronic device including a flexible display according to an embodiment of the disclosure.

Referring to FIG. 3, a foldable electronic device 300 (e.g., the electronic device 101 in FIG. 1) according to various embodiments may include a housing structure 320 including a first housing 321 and the second housing 322 with reference to a folding axis (e.g., axis B), a foldable display 310 (e.g., the display module 160 in FIG. 1), and/or a hinge part 330, and may include at least some of the structure and/or functions of the electronic device 101 in FIG. 1. The first housing 321 and/or the second housing 322 may be put on each other by the hinge part 330, and may be laid on each other by being folded about at least one axis.

According to various embodiments, the housing structure 320 may include the first housing 321, the second housing 322, and/or the hinge part 330. The first housing 321 may include a first surface S5 and a second surface S6, and the second housing 322 may include a third surface S7 and a fourth surface S8. For example, when the display 310 of the electronic device 300 is folded about the hinge part 330 (e.g., axis B), the first surface S5 of the first housing 321 may be put on the third surface S7 of the second housing 322 while facing the third surface S7. The state of the electronic device 300 is a folded state, for example, an angle (e.g., angle B) formed by the first surface S5 of the first housing 321 and the third surface S7 of the second housing 322 may be a narrow angle (e.g., about 0 to about 5 degrees). The folded state may be a close state or closed state, and may be a state in which the electronic device 300 is completely folded. The display 310 may be divided into a first region 311 and a second region 312 that are regions into which first display 210 is physically divided with reference to axis B. The first region may be positioned on the first surface S5 of the first housing 321, and the second region may be positioned on the third surface S7 of the second housing 322.

The first housing 321 and the second housing 322 may be disposed at upper and lower sides with reference to the hinge part 330 (e.g., axis B), and may have shapes which are overall symmetrical with respect to the hinge part 330. Referring to FIG. 3, the first housing 321 may be positioned in the +Z-axis direction (at the upper side), and the second housing 322 may be positioned in the −Z-axis direction (at the lower side). The first housing 321 and the second housing 322 may be configured to be folded with respect to each other, and may be put on each other in a folded state or a closed state so that the first surface S5 of the first housing 321 faces the third surface S7 of the second housing 322.

According to various embodiments, the hinge part 330 may be formed between the first housing 321 and the second housing 322, and thus the first housing 321 and the second housing 322 of the electronic device 300 may be folded to be put on each other. However, the housing structure of the electronic device, in which housings are disposed at upper and lower sides with reference to the folding axis (e.g., axis B), may be merely one example, and may have housings disposed at left and right sides with reference to the folding axis of the electronic device.

According to various embodiments, the shape of the housing structure 320 of the electronic device 300 may vary. For example, with reference to the hinge part 230, the first housing 321 and the second housing 322 may be moved by being unfolded or folded. According to an embodiment, the first housing 321 and the second housing 322 may form a folding angle (e.g., angle B). According to various embodiments, the folding angle (e.g., angle B) may be changed. For example, angle B may have a size of about 0 degrees to about 180 degrees. In another example, angle B may have a size of about 0 degrees to about 360 degrees. An angle and a length formed between the first housing 321 and the second housing 322 may vary depending on whether the state of the electronic device 300 is an unfolded state (or opened state), a folded state (or a closed state), or an intermediate state. For example, the unfolded state may be an open state, a flat state, or an opened state. The state in which the display 310 of the electronic device 300 is unfolded is a state in which the first housing 321 and the second housing 322 are arranged at the upward/downward direction, and may be a state in which the electronic device 300 is completely unfolded. When the state of the electronic device is the unfolded state, the angle between the first housing 321 and the second housing 322 may be about 180 degrees, and the first surface S5 of the first housing 321 and the third surface S7 of the second housing 322 may be arranged to face a substantially identical direction. The intermediate state, among states of the electronic device 300, is a state in which the first housing 321 and the second housing 322 may be arranged with a predetermined angle therebetween, and may be an intermediate state between the folded state and the unfolded state. The intermediate state may be a state in which angle B is a predetermined angle (e.g., about 6 to about 179 degrees).

According to various embodiments, although not illustrated, the electronic device 300 may include a sensor module, and/or may include a camera module.

According to an embodiment, the sensor module may be disposed under the display 310 (e.g., in the −Z direction from the display 310), and may detect an external environment, based on information (e.g., light) received through the display 310. According to an embodiment, the sensor module may include at least one among a receiver, a proximity sensor, an ultrasonic sensor, a gesture sensor, a gyro sensor, a barometric pressure sensor, a magnetic sensor, an acceleration sensor, a grip sensor, a color sensor, an infrared (IR) sensor, a biosensor, a temperature sensor, or a humidity sensor. According to an embodiment, at least some sensor modules of the electronic device 300 may be visually exposed outside through a partial region of the display 310. According to an embodiment, the electronic device 300 may detect a folding angle (e.g., angle B) by using the sensor module. According to an embodiment, the electronic device 300 may include at least one of each sensor (e.g., the acceleration sensor, the gyro sensor, and/or the magnetic sensor) in multiple housings (e.g., the first housing 321 and/or the second housing 322). In another example, the electronic device 300 may include each sensor (e.g., the acceleration sensor, the gyro sensor, and/or the magnetic sensor) in only one of the multiple housings (e.g., the first housing 321 and/or the second housing 322).

According to various embodiments, the electronic device 300 may include at least one antenna. The at least one antenna may receive a communication signal outside the electronic device 300. According to an embodiment, the at least one antenna may be disposed in partial regions (e.g., a first antenna region 351 and a second antenna region 352) of end parts of housings (e.g., the first housing 321 and the second housing 322) of the electronic device 300. According to an embodiment, the at least one antenna may be disposed toward the outside of the electronic device 300, and may include segment parts (e.g., a first antenna segment 361 and a second antenna segment 362) containing a conductive material.

Figure 4:
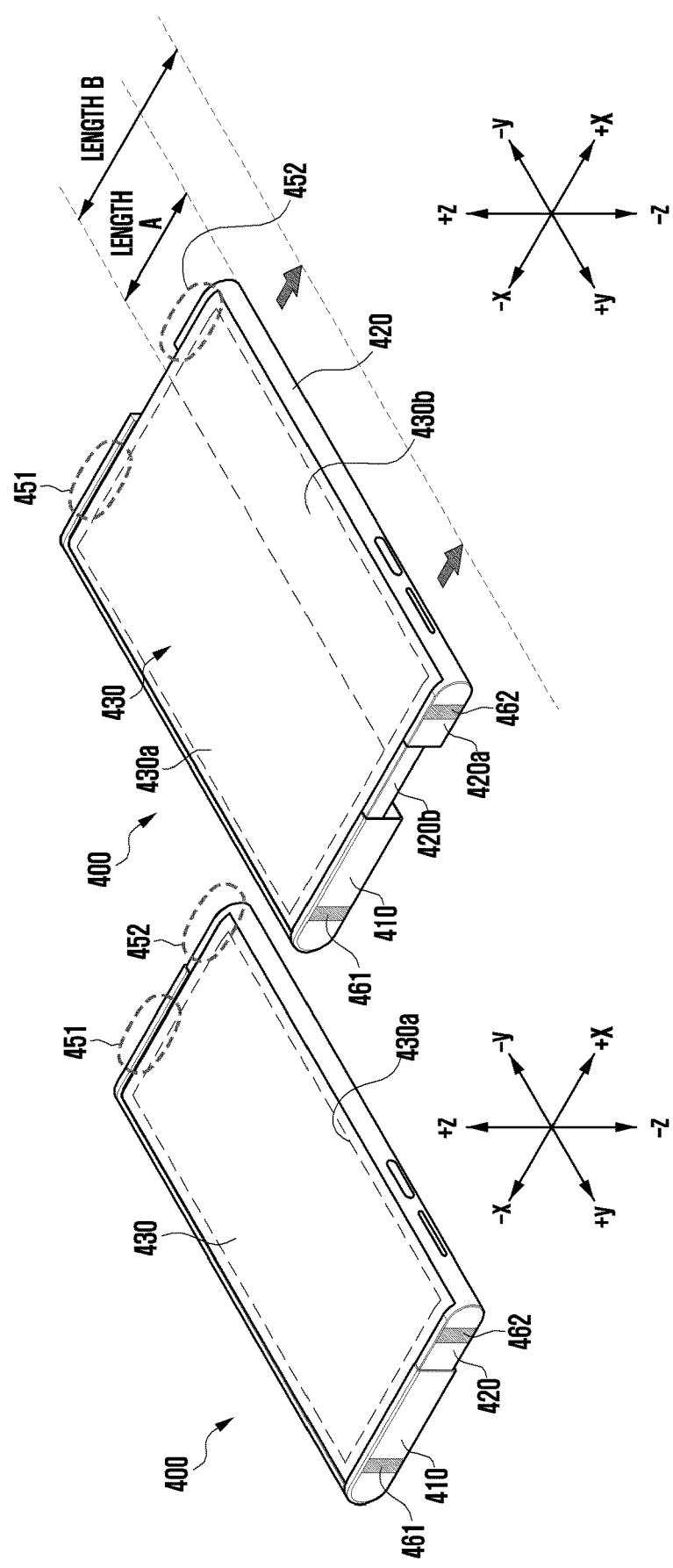
FIG. 4 is an illustration showing a structure and a state change of an electronic device including a flexible display according to an embodiment of the disclosure.

FIG. 4 is an illustration showing a structure and a state change of an electronic device including a flexible display according to an embodiment of the disclosure.

Referring to FIG. 4, an electronic device 400 (e.g., the electronic device 101 in FIG. 1) according to various embodiments may include a first housing 410 and a second housing 420. According to an embodiment, the second housing 420 may move in a designated direction, for example, a first direction (the +X direction, from the first housing 410. For example, the second housing 420 may slide a designated distance in the first direction (the +X direction) from the first housing 410. According to an embodiment, the second housing 420 may reciprocate within the designated distance in the first direction (the +X direction) from a part of the first housing 410.

In various embodiments herein, a state in which the second housing 420 slides in the first direction (the +X direction) from the first housing 410 may be defined as a second state (e.g., an extended state or a slide-out state) of the electronic device 400. In various embodiments herein, the second state of the electronic device 400 may be defined as a state in which a second part 430b of the display 430 is visually exposed outside. Alternatively, the second state of the electronic device 400 may be a state in which the second part 430b of the display 430 is positioned outside the second housing 420. According to an embodiment, the second housing 420 may move in the first direction (the +X direction) from the first housing 410, and thus at least a part of the second housing 420 and/or the second part 430b of the display 430 may be withdrawn, and a withdrawn length (e.g., length A) may be formed to correspond to a movement distance. According to an embodiment, the second housing 420 may reciprocate within a designated distance (e.g., length B). According to an embodiment, the withdrawn length (e.g., length A) may have a size of about 0 to length B.

In various embodiments herein, a state in which the second housing 420 slides toward the first housing 410, for example, in a second direction (the −X direction) opposite to the first direction (the +X direction) may be defined as a first state (e.g., a contracted state or a slide-in state) of the electronic device 400. In various embodiments herein, the first state of the electronic device 400 may be defined as a state in which the second part 430b of the display 430 is not visually exposed outside. Alternatively, the first state of the electronic device 400 may be a state in which the second part 430b of the display 430 is placed in the second housing 420.

In various embodiments, the first state may be called a first shape, and the second state may be called a second shape. For example, the first shape may include a normal state, a reduced state, or a closed state, and the second shape may include an opened state. Furthermore, in an embodiment, the electronic device 400 may form a third state (e.g., an intermediate state) which is a state between the first state and the second state. For example, the third state may be called a third shape, and the third shape may include a free stop state.

In switching between the second state and/or the first state, the electronic device 400 according to various embodiments herein may be manually switched by a user's manipulation, or may be automatically switched through a driving module (not shown) disposed in the first housing 410 or the second housing 420. According to an embodiment, the operation of the driving module may be triggered based on a user input. According to an embodiment, the user input for triggering the operation of the driving module may include a touch input, a force touch input, and/or a gesture input through the display 430. In another embodiment, the user input for triggering the operation of the driving module may include a voice input, or an input through a physical button exposed outside the first housing 410 or the second housing 420. According to an embodiment, the driving module may be driven in a semi-automatic manner in which the operation thereof is triggered when manual manipulation by an external force of a user is sensed.

According to an embodiment, the electronic device 400 may be called a "slidable electronic device" because the second housing 420 is configured to slide, or may be called a "rollable electronic device" because at least a part of the display 430 is configured to be rolled in the second housing 420 (or the first housing 410) based on sliding of the second housing 420.

According to an embodiment, in the electronic device 400, the second housing 420 may be coupled so as to at least partially slide from the first housing 410. According to an embodiment, the form of coupling between the first housing 410 and the second housing 420 is not limited to the form and coupling illustrated in FIG. 4, and may be implemented by a combination and/or coupling of other shapes or components.

According to an embodiment, the second housing 420 of the electronic device 400 may include side members 420a and 420b surrounding a partial side surface of the electronic device 400. According to an embodiment, the side members 420a and 420b of the second housing 420 may include a first side member 420a, which is always visually exposed outside in the second state and the first state of the electronic device 400 without being inserted into the second housing 420, and a second side member 420b, which is inserted into or withdrawn out of the inner space of the second housing 420 through one end of the second housing 420.

According to an embodiment, the second side member 420b of the second housing 420 may not be visually exposed outside in the first state, but may be visually exposed outside in the second state.

According to an embodiment, the display 430 may be disposed to be visually exposed outside in the forward direction (e.g., the +Z direction) of each of the first housing 410 and the second housing 420. According to an embodiment, a display region of the display 430 may include a first part 430a and the second part 430b.

According to an embodiment, the first part 430a of the display 430 may be a display region always visually exposed outside regardless of whether the electronic device 400 is in the second state or the first state. For example, the first part 430a of the display 430 may be fixed without moving regardless of sliding of the second housing 420.

According to an embodiment, the second part 430b of the display 430 may be a display region extending from one end of the first part 430a, and may be inserted into the inner space of the second housing 420 or withdrawn out of the inner space of the second housing 420 depending on sliding of the second housing 420. According to an embodiment, a hole (not shown) through which the second part 430b of the display 430 is withdrawn or inserted may be disposed adjacent to the +X-direction side surface of the second housing 420. For example, the second part 430b of the display 430 may be withdrawn from or inserted into a +X-direction boundary part of the second housing 420.

According to an embodiment, in the second state, the second part 430b of the display 430 may be withdrawn out of the inner space of the second housing 420 and may be visually exposed outside. According to an embodiment, in the first state, the second part 430b of the display 430 may be inserted into the inner space of the second housing 420 and may not be visually exposed outside.

According to an embodiment, the second part 430b of the display 430 may include a flexible display. The second part 430b may be inserted in a bent state while being rolled into the inner space of the second housing 420 in the first state.

According to an embodiment, in the case of the display area of the display 430 in the first state, only the first part 430a of the display 430 may be visually exposed outside.

According to an embodiment, in the case of the display area of the display 430 in the second state, the first part 430a and the second part 430b of the display 430 may be visually exposed outside.

According to various embodiments, although not illustrated, the electronic device 400 may include a sensor module and/or a camera module.

According to an embodiment, the sensor module may be disposed under the display 430 (e.g., in the −Z direction from the display 430), and may detect an external environment, based on information (e.g., light) received through the display 430. According to an embodiment, the sensor module may include at least one among a receiver, a proximity sensor, an ultrasonic sensor, a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, a motor encoder, or an indicator. According to an embodiment, at least some sensor modules of the electronic device 400 may be visually exposed outside through a partial region of the display 430. According to an embodiment, the electronic device 400 may use the sensor module to sense a withdrawn length (e.g., length A). According to an embodiment, the electronic device 400 may generate withdrawal information about the withdrawn degree sensed by the sensor. For example, the electronic device 400 may use the withdrawal information to sense and/or determine the degree to which the second housing 420 is withdrawn. According to an embodiment, the withdrawal information may include information about the withdrawn length of the second housing 420.

The electronic device 400 according to various embodiments may include housings (e.g., the first housing 410 and the second housing 420), and the display 430 supported by the housings 410 and 420 and having a display region, the area of which is adjusted according to the movement of at least a part of the housings 410 and 420 in a first direction, wherein the display region includes the first part 430a, which is always exposed outside regardless of the movement of the at least part of the housings 410 and 420 in the first direction, and the second part 430b, which extends from one end of the first part 430a and is exposed outside by being withdrawn out of the inner space of the housings 410 and 420 according to the movement of the at least part of the housings 410 and 420 in the first direction.

According to various embodiments, the electronic device 400 may include at least one antenna. The at least one antenna may receive a communication signal outside the electronic device 400. According to an embodiment, the at least one antenna may be disposed in partial regions (e.g., a first antenna region 451 and a second antenna region 452) of end parts of the housings (e.g., the first housing 421 and the second housing 422) of the electronic device 400. According to an embodiment, the at least one antenna may be disposed toward the outside of the electronic device 400, and may include segment parts (e.g., a first antenna segment 461 and a second antenna segment 462) including a conductive material.

Figure 5:
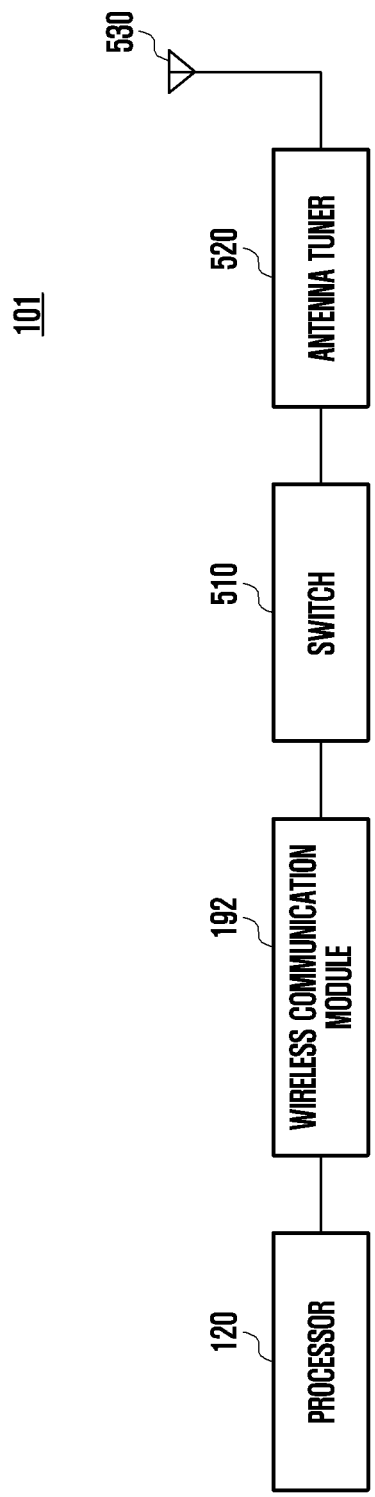
FIG. 5 is a block diagram of an electronic device according to an embodiment of the disclosure.

FIG. 5 is a block diagram of an electronic device according to an embodiment of the disclosure.

Referring to FIG. 5, an electronic device 101 (e.g., the electronic device 101 in FIG. 1) may include a processor 120, a wireless communication module 192, a switch 510, an antenna tuner 520, and/or at least one antenna 530. The electronic device 101 may include at least some of the elements and/or functions of the electronic device 101 in FIG. 1.

According to an embodiment, the processor 120 may include at least some of the elements and/or functions of the processor 120 in FIG. 1. The wireless communication module 192 may include at least some of the elements and/or functions of the wireless communication module 192 in FIG. 1. At least one of the switch 510 or the antenna tuner 520 may be included in the wireless communication module 192 in FIG. 1.

According to various embodiments, the wireless communication module 192 may include a transceiver, an amplification module, and a front end module (FEM). According to an embodiment, the transceiver may convert data received from the processor 120 (e.g., a communication processor) into an RF signal (e.g., a transmission (Tx) signal) and may output the RF signal to the front end module (FEM) through the amplification module. Furthermore, the transceiver may convert an RF signal (e.g., a reception (Rx) signal) received from the front end module (FEM) into digital data readable in the processor 120 and may transfer the digital data to the processor 120. According to an embodiment, the amplification module may include a power amplifier and low noise amplifier. The power amplifier may amplify power of an RF signal (e.g., the Tx signal) received from the transceiver and may transmit the RF signal to the front end module (FEM). The low-noise amplifier may amplify power while minimizing noise of an RF signal (e.g., the Rx signal) received from the front end module (FEM) and may transmit the RF signal to the transceiver. According to an embodiment, the front end module (FEM) may include a duplexer and/or a diplexer, and may separately output transmission and reception signals. In an example, the front end module (FEM) may output an RF signal (e.g., the Tx signal), received from the transceiver through an input port, to an antenna 260 through an input/output port, and may output an RF signal (e.g., the Rx signal), received from the antenna 260 through the input/output port, to the transceiver through an output port.

According to various embodiments, the switch 510 may connect the wireless communication module 192 to the at least one antenna 530. According to an embodiment, the switch 510 may connect, to the wireless communication module 192, an antenna 530 to be used for wireless communication among the at least one antenna 530.

According to various embodiments, the antenna tuner 520 may adjust, based on a tuning code selected by the processor 120, impedance of the antenna 530 so as to approximate at least one reference impedance. In an example, the antenna tuner 520 may include at least one of a register, an inductor, or a capacitor. For example, the antenna tuner 520 may adjust, based on the tuning code, an electrical length (e.g., the capacitor, the inductor, or the resister) between the antenna 530 and the wireless communication module 192 to reduce reflection due to the impedance difference between the antenna 530 and the wireless communication module 192. According to an embodiment, the antenna tuner 520 may match the impedance of the antenna 530 by activating at least some of capacitors included in the antenna tuner 520 or at least some of inductors included in the antenna tuner 520.

According to various embodiments, the sensor module 176 may sense the outer or inner state of the electronic device 101, and may generate an electrical signal or a data value corresponding to the sensed state. According to an embodiment, the sensor module 176 may include at least one among a proximity sensor, a gyro sensor, a magnetic sensor, an acceleration sensor, a grip sensor, or a motor encoder. According to an embodiment, the sensor module 176 may use the gyro sensor, the acceleration sensor, or the magnetic sensor to sense a folding angle (e.g., angle A in FIG. 2 or 3). According to an embodiment, the sensor module 176 may use the magnetic sensor or the acceleration sensor to sense a withdrawn length (e.g., length A in FIG. 4) of the second housing (e.g., the second housing 420 in FIG. 4).

According to various embodiments, the processor 120 may be electrically connected to various elements (e.g., the wireless communication module 192, the switch 510, or the antenna tuner 520) of the electronic device 101 so as to control the various elements, and may perform calculation and processing of various types of data. According to an embodiment, the processor 120 may include an application processor (AP) (e.g., the main processor 121 in FIG. 1) and/or a communication processor (CP) (e.g., the auxiliary processor 123 in FIG. 1). The type and/or amount of operation, calculation, and data processing, which may be performed by the processor 120, are not limited. However, herein, a description will be made of only an impedance matching method of the electronic device 101 according to various embodiments, and elements and functions of the processor 120 related to operation of performing the method.

According to various embodiments, the processor 120 may determine the folding angle or the withdrawn length of the electronic device 101. The electronic device 101 may be a foldable type electronic device (hereinafter, a foldable electronic device) like, for example, the electronic device 200 or 300 in FIG. 2 or 3. In another example, the electronic device 101 may be a rollable type electronic device (hereinafter, a rollable electronic device) like the electronic device 400 in FIG. 4. According to an embodiment, when the electronic device 101 is a foldable electronic device, the processor 120 may determine a folding angle (e.g., angle A in FIG. 2 or 3) of the electronic device 101. According to an embodiment, when the electronic device 101 is a rollable electronic device, the processor 120 may determine the withdrawn length (e.g., length A in FIG. 4) of the electronic device 101. According to various embodiments, the processor 120 may use the sensor module 176 to determine the folding angle of the electronic device 101. According to an embodiment, the processor 120 may use at least one among the gyro sensor, the acceleration sensor, and the magnetic sensor to determine the folding angle. The folding angle may be one of, for example, values of about 0 degrees to about 180 degrees. In another example, the folding angle may be one of values of about 0 degrees to about 360 degrees. According to an embodiment, the processor 120 may determine the withdrawn length of the second housing (e.g., the second housing 420 in FIG. 4). The withdrawn length may have, for example, a value of 0 to a maximum withdrawn length (e.g., length B in FIG. 4). According to an embodiment, the processor 120 may periodically and/or continuously determine the folding angle or the withdrawn length of the electronic device 101. The processor 120 may determine, based on folding information, the degree by which the electronic device 101 is folded. According to an embodiment, the processor 120 may use the sensor module 176 to determine the degree by which the electronic device 101 is folded. The processor 120 may generate folding information based on a result sensed by the sensor module 176 as the electronic device 101 is folded. According to an embodiment, the electronic device 400 may generate folding information about the folded degree of the electronic device 101, sensed by the sensor. For example, the electronic device 400 may use the folding information to sense and/or determine the folded degree of the electronic device 101. According to an embodiment, the folding information may include information about the folding angle of the electronic device 101.

According to various embodiments, the processor 120 may select an index corresponding to the folding angle or the withdrawn length. The folding angle may be a folded degree or folding information. For example, the folding information may be a value into which the processor 120 has read a result sensed by the sensor module 176, or data into which the processor 120 has processed the result sensed by the sensor module 176. The withdrawn length may be understood as a withdrawn degree or withdrawal information. For example, the withdrawal information may be a value into which the processor 120 has read a result sensed by the sensor module 176, or data into which the processor 120 has processed the result sensed by the sensor module 176. The index may be information in which multiple impedance values, which the at least one antenna 530 may have, are sampled. The processor 120 may select, from among multiple indices, an index based on the folding angle or the withdrawn length determined by using the sensor module 176. According to an embodiment, the processor 120 may determine an impedance value of the antenna 530 corresponding to the folding angle or the withdrawn length, and may select an index corresponding to the determined impedance value. According to an embodiment, the processor 120 may select an index having a value most approximate to a real impedance value as an index corresponding to the real impedance value. The electronic device 101 may store information about multiple predetermined indices in a memory (e.g., the memory 130 in FIG. 1), and may store information about an impedance value corresponding to each index. The processor 120 may select a corresponding index, based on an impedance value corresponding to the folding angle or the withdrawn length. According to an embodiment, the memory 130 may store data related to an impedance value corresponding to the folding angle or the withdrawn length, and the processor 120 may determine the impedance value corresponding to the folding angle or the withdrawn length. The processor 120 may select, based on the determined impedance value, an index corresponding to the impedance value. According to an embodiment, the memory 130 may store data in which the folding angle or the withdrawn length is mapped to an index, and the processor 120 may select, based on the determined folding angle or withdrawn length, an index corresponding thereto.

According to various embodiments, the processor 120 may apply a tuning code corresponding to the selected index. The tuning code may be information corresponding to the index. For example, the processor 120 may apply the tuning code to the antenna tuner 520. According to various embodiments, the processor 120 may apply the tuning code corresponding to the selected index to the antenna tuner 520. The processor 120 may control the antenna tuner 520, based on the tuning code corresponding to the selected index. According to an embodiment, the processor 120 may control the antenna tuner 520 to activate or deactivate at least some among at least one of one or more inductors, one or more capacitors, or one or more resistors, included in the antenna tuner 520. The processor 120 may control an element (e.g., the inductor, the capacitor, or the resistor) of the antenna tuner 520 to match impedance of the antenna 530.

According to an embodiment, the processor 120 may determine whether there is an index corresponding to the determined angle or length. For example, the determined angle or length may have a continuous value, and there may be no corresponding index. The memory 130 of the electronic device 101 may store only an index corresponding to a predetermined angle (e.g., 0 degrees, 60 degrees, 120 degrees, and 180 degrees) or a predetermined length, and the processor 120 may determine whether the index corresponding to the determined angle or length is stored in the memory 130.

According to an embodiment, when there is an index corresponding to the determined angle or length, the processor 120 may select the corresponding index.

According to an embodiment, when there is no index corresponding to the determined angle or length, the processor 120 may determine a most approximate angle or length having a corresponding index, and may select the index corresponding to the determined angle or angle. For example, when the folding angle determined by the processor 120 is 50 degrees, and when the electronic device 101 stores only information about an index corresponding to 0 degrees and an index corresponding to 60 degrees, the processor 120 may select 60 degrees, which is most approximate to 50 degrees, from among 0 degrees and 60 degrees, and may select an index corresponding to the selected 60 degrees.

According to various embodiments, the processor 120 may interpolate an impedance value, based on the determined angle or length. When there is no index corresponding to the determined angle or length, the processor 120 may interpolate an impedance value by using an angle or length having a corresponding index and the determined angle or length. The processor 120 may determine an interpolation ratio, and may interpolate an impedance value, based on the interpolation ratio. According to an embodiment, the interpolation ratio may be determined based on a ratio in which the determined angle internally divides at least two angles having corresponding indices. According to an embodiment, the processor 120 may acquire an interpolated value by applying the interpolation ratio to two or more index values. For example, when the electronic device 101 stores only indices corresponding to 0 degrees and 180 degrees, the processor 120 may interpolate the index corresponding to 0 degrees and the index corresponding to 180 degrees, based on a ratio in which a determined angle (e.g., angle A) internally divides 0 degrees and 180 degrees. According to an embodiment, a value interpolated and acquired by the processor 120 may be deemed to be an impedance value of the antenna 530 corresponding to the determined angle. According to an embodiment, the interpolation ratio may be determined based on a ratio in which the determined length internally divides two or more lengths having corresponding indices. According to an embodiment, the processor 120 may acquire an interpolated value by applying the interpolation ratio to two or more index values. For example, when the electronic device 101 stores only indices corresponding to 0 cm and 10 cm, the processor 120 may interpolate the index corresponding to 0 cm and the index corresponding to 10 cm, based on a ratio in which a determined length (e.g., length A) internally divides 0 cm and 10 cm. According to an embodiment, a value interpolated and acquired by the processor 120 may be deemed to be an impedance value of the antenna 530 corresponding to the determined length. According to an embodiment, the processor 120 may linearly interpolate each index value. For example, the processor 120 may store the Smith chart and data in which an impedance value corresponding to each region of the Smith chart is mapped, and may linearly interpolate the impedance value, based on the Smith chart, an index value, and an interpolation ratio.

According to various embodiments, the processor 120 may apply the interpolated impedance value. According to an embodiment, the processor 120 may determine an index corresponding to the interpolated impedance value (e.g., the interpolated value). For example, the processor 120 may determine an index nearest to the interpolated value. The processor 120 may apply the index nearest to the interpolated value to the antenna tuner 520 to perform impedance matching.

Figure 6:
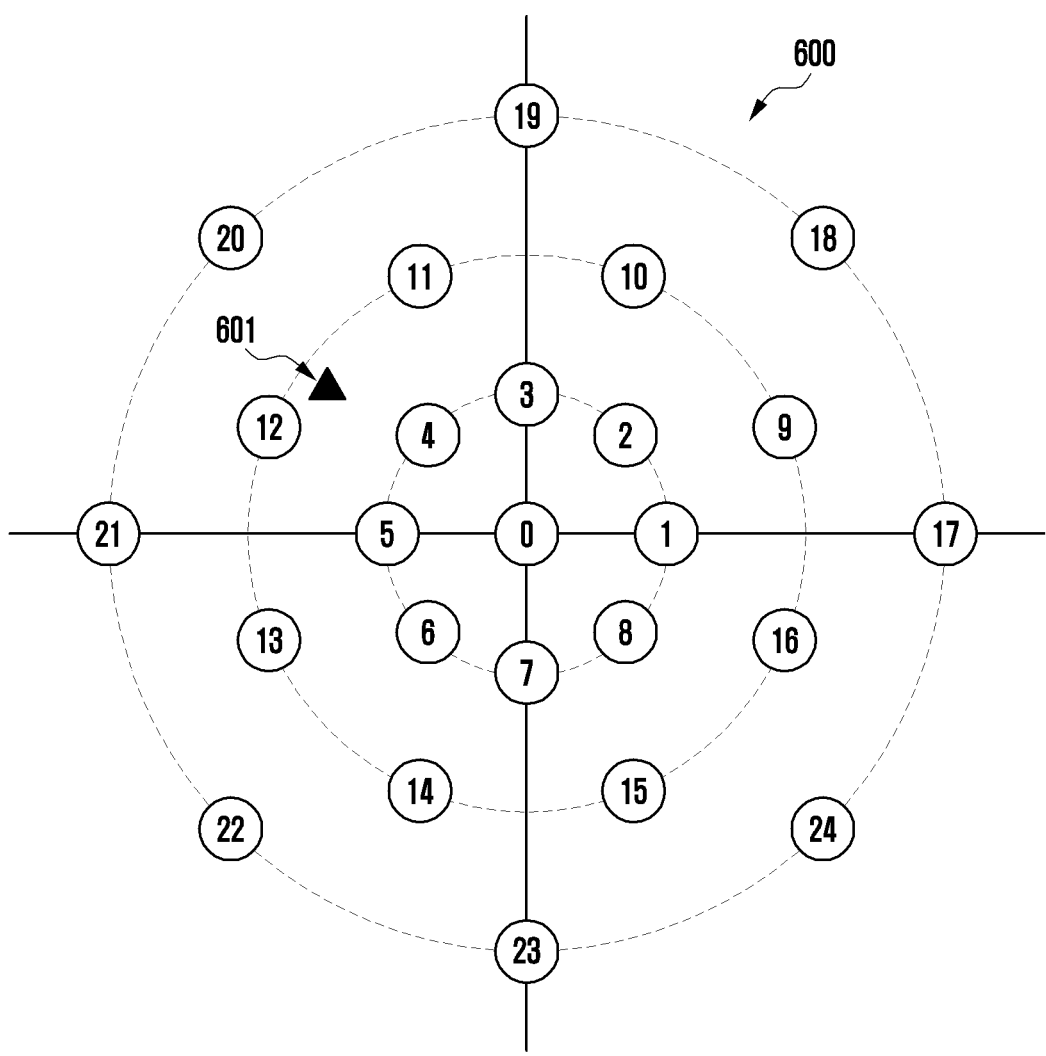
FIG. 6 is a graph showing indices sampled to correspond to antenna impedance according to an embodiment of the disclosure.

FIG. 6 is a graph showing indices sampled to correspond to antenna impedance according to an embodiment of the disclosure.

Referring to FIG. 6, an electronic device (e.g., the electronic device 101 in FIG. 1) may store data including an impedance graph 600 and multiple indices (index 0 to index 24) sampled on the impedance graph 600. According to various embodiments, the multiple indices displayed on the impedance graph 600 may be data sampled by a predetermined number of (e.g., 25) impedance values among impedance values that an antenna (e.g., the antenna 530 in FIG. 5) may have. In various embodiments of the disclosure, 25 sampled indices are illustrated and described. However, this is merely one example, and the number of indices is not limited.

The multiple indices (index 0 to index 24) may correspond to tuning codes. The tuning codes may be values which the processor 120 of the electronic device 101 applies to an antenna tuner (e.g., the antenna tuner 520 in FIG. 5) in order to control the antenna tuner 520. According to an embodiment, the processor 120 of the electronic device 101 may select one index from among the multiple indices (index 0 to index 24), and may apply a tuning code corresponding to the selected index to the antenna tuner 520.

According to various embodiments, the electronic device 101 may determine impedance of the antenna 530, and may select an index corresponding to the determined impedance. According to an embodiment, the electronic device 101 may select an index nearest to a determined impedance value. Referring to FIG. 6, the electronic device 101 may measure impedance of the antenna 530, and may select an index (e.g., index 12) nearest to the measured impedance 601. In this case, the electronic device 101 may apply a tuning code corresponding to index 12 to the antenna tuner 520 to match antenna impedance.

FIGS. 7 and 8 are impedance graphs based on the frequency and folding angle of a foldable electronic device according to various embodiments of the disclosure.

FIG. 9 is an impedance graph based on the folding angle of a foldable electronic device according to an embodiment of the disclosure.

Referring to FIGS. 7 and 8, multiple impedance graphs (e.g., a graph 710, a graph 720, a graph 730, and a graph 740) may be graphs showing impedance values of an antenna (e.g., the antenna 530 in FIG. 5) corresponding to different folding angles and frequencies of the electronic device 101. For example, the graph 710 may indicate an impedance graph at 0 degrees, the graph 720 may indicate an impedance graph at 60 degrees, the graph 730 may indicate an impedance graph at 120 degrees, and the graph 740 may indicate an impedance graph at 180 degrees.

Referring to part (a) of FIG. 7, when the folding angle of the electronic device 101 is 0 degrees, impedance values (e.g., a value 711, a value 712, and a value 713) that the at least one antenna 530 has may vary depending on a frequency band of the antenna 530. For example, the impedance values may be changed so as to correspond to an identical frequency band. For example, the antenna 530 may include at least one antenna tuner including at least one of a resistor, a capacitor, or an inductor, and the antenna tuner may activate different antenna elements depending on frequency bands, and thus impedance values may be different.

Referring to parts (a) and (b) of FIG. 7 and parts (c) and (d) of FIG. 8, when the folding angle of the electronic device 101 is 60 degrees, the at least one antenna 530 may have different impedance values (e.g., a value 721, a value 722, and a value 723) depending on frequency bands.

When the folding angle of the electronic device 101 is 120 degrees, the at least one antenna 530 may have different impedance values (e.g., a value 731, a value 732, and a value 733) depending on frequency bands. When the folding angle of the electronic device 101 is 180 degrees, the at least one antenna 530 may have different impedance values (e.g., a value 741, a value 742, and a value 743) depending on frequency bands. According to an embodiment, as the folding angle of the antenna changes at the time of measuring impedance values, an impedance value in each frequency band may change with an identical or similar transition.

Referring to FIG. 9, a graph 910 shows impedance values (the value 711, the value 721, the value 731, and the value 741) of the antenna 530 corresponding to a frequency of an identical first band. Referring to FIG. 9, the value 711, the value 721, the value 731, and the value 741 each may correspond to the frequency of the first band, and may be impedance values of the antenna 530 when the folding angle corresponds to 0 degrees, 60 degrees, 120 degrees, and 180 degrees.

Referring to part (e) of FIG. 9, it may be analyzed that the impedance value of the antenna 530 according to angles in an identical frequency band changes while drawing a curve similar to a straight line.

Referring to part (f) of FIG. 9, the electronic device 101 may obtain an estimated impedance value by using points (e.g., a value 922 and a value 923) at which the value 711, the value 721, the value 731, and the value 741 are linearly fitted on an impedance graph 920. According to an embodiment, the electronic device 101 may store values (e.g., the value 922 and the value 923) approximated by fitting antenna impedance values (e.g., the value 711, the value 721, the value 731, and the value 741) according to folding angles, or may linearly interpolate and acquire an impedance value when the folding angle is 60 degrees or 120 degrees, based on a reference value, for example, an impedance value (e.g., the value 711) when the folding angle is 0 degrees and an impedance value (e.g., the value 741) when the folding angle is 180 degrees. According to an embodiment, the electronic device 101 may store an index corresponding to each of the impedance value (e.g., the value 711) at 0 degrees and the impedance value (e.g., the value 741) at 180 degrees. According to an embodiment, the electronic device 101 may store, as an index at 60 degrees and an index at 120, values (e.g., the value 923 and the value 922) interpolated by internally dividing the index at 0 degrees and the index at 180 degrees by 60 degrees or 120 degrees, respectively.

According to an embodiment, the electronic device 101 may store, as an index value, an impedance value corresponding to a predetermined folding angle. For example, the electronic device 101 may store, as index values, impedance values when the folding angle is 0 degrees, 45 degrees, 90 degrees, 135 degrees, and 180 degrees, respectively. In this case, the electronic device 101 may refer, based on the determined folding angle of the electronic device 101, to an index value corresponding to an angle having a most approximate value to obtain an approximation of an impedance value. For example, the electronic device 101 may refer to an index value at 0 degrees when the folding angle of the electronic device 101 is 0 to 22 degrees, may refer to an index value at 45 degrees when the folding angle of the electronic device 101 is 22 to 67 degrees, may refer to an index value at 90 degrees when the folding angle of the electronic device 101 is 67 to 112 degrees, may refer to an index value at 135 degrees when the folding angle of the electronic device 101 is 112 to 157 degrees, and may refer to an index value at 180 degrees when the folding angle of the electronic device 101 is 157 to 180 degrees. The above predetermined folding angles are merely one example, and the electronic device 101 may store, as an index value, an impedance value at an angle different from the above-mentioned angles. According to an embodiment, the electronic device 101 may apply a tuning code corresponding to a value approximated to be an index value.

According to an embodiment, the electronic device 101 may store a tuning code value corresponding to a predetermined folding angle. For example, the electronic device 101 may store impedance values when the folding angle is 0 degrees, 45 degrees, 90 degrees, 135 degrees, and 180 degrees, respectively, and tuning code values corresponding to the impedance values. In this case, the electronic device 101 may refer to and apply, based on the determined folding angle of the electronic device 101, a tuning code value corresponding to a most approximate angle. For example, the electronic device 101 may refer to a tuning code value at 0 degrees when the folding angle of the electronic device 101 is 0 to 22 degrees, may refer to a tuning code value at 45 degrees when the folding angle of the electronic device 101 is 22 to 67, may refer to a tuning code value at 90 degrees when the folding angle of the electronic device 101 is 67 to 112 degrees, may refer to a tuning code value at 135 degrees when the folding angle of the electronic device 101 is 112 to 157 degrees, and may refer to a tuning code value at 180 degrees when the folding angle of the electronic device 101 is 157 to 180 degrees. The above predetermined folding angles are mere one example, and the electronic device 101 may store a tuning code value at an angle different from the above-mentioned angles.

Figure 10:
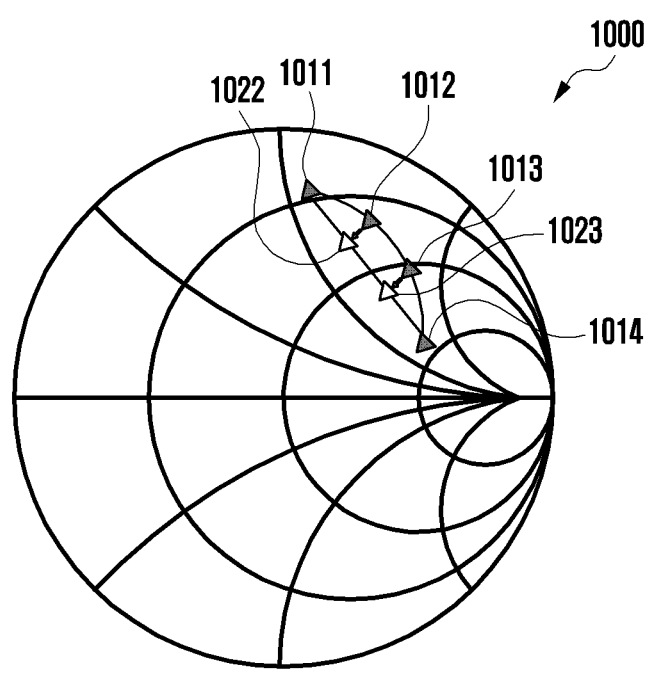
FIG. 10 is an impedance graph based on a withdrawn length of a rollable electronic device according to an embodiment of the disclosure.

FIG. 10 is an impedance graph based on a withdrawn length of a rollable electronic device according to an embodiment of the disclosure.

Referring to FIG. 10, a graph 1000 shows impedance values (a value 1011, a value 1012, a value 1013, and a value 1014) of the antenna 530 corresponding to an identical frequency. As in the graph 920 in FIG. 9, the value 1011, the value 1012, the value 1013, and the value 1014 may be points indicating changes in real impedance value of the antenna 530 depending on the withdrawn length. For example, impedance of the antenna 530 may have the value 1011 when the withdrawn length is 0, may have the value 1012 when the withdrawn length is 3 cm, may have the value 1013 when the withdrawn length is 6 cm, and may have the value 1014 when the withdrawn length is 9 cm. Referring to FIG. 10, the value 1011, the value 1012, the value 1013, and the value 1014 each may correspond to a frequency of a first band, and may be impedance values of the antenna 530 when the withdrawn length corresponds to 0 cm, 3 cm, 6 cm, and 9 cm. Referring to FIG. 10, it may be analyzed that the impedance value of the antenna 530 according to angles in an identical frequency band changes while drawing a curve similar to a straight line. Referring to FIG. 10, the electronic device 101 may obtain an estimated impedance value by using points (e.g., a value 1022 and a value 1023) to which the value 1011, the value 1012, the value 1013, and the value 1014 are linearly fitted on an impedance graph 1020. According to an embodiment, the electronic device 101 may store an index corresponding to each of an impedance value (e.g., the value 1011) at 0 cm and an impedance value (e.g., the value 1014) at 9 cm. According to an embodiment, the electronic device 101 may store, as indices at 3 cm and 6 cm, values (e.g., the value 1023 and the value 1022 interpolated by internally divide an index at 0 cm and an index at 9 cm by 3 cm or 6 cm, respectively.

According to an embodiment, the electronic device 101 may store, as an index value, an impedance value corresponding to a predetermined folding angle. For example, the electronic device 101 may store, as index values, impedance values when the folding angle is 0 degrees, 45 degrees, 90 degrees, 135 degrees, and 180 degrees, respectively. In this case, the electronic device 101 may refer, based on the determined folding angle of the electronic device 101, to an index value corresponding to an angle having a most approximate value to obtain an approximation of an impedance value. For example, the electronic device 101 may refer to an index value at 0 degrees when the folding angle of the electronic device 101 is 0 to 22 degrees, may refer to an index value at 45 degrees when the folding angle of the electronic device 101 is 22 to 67 degrees, may refer to an index value at 90 degrees when the folding angle of the electronic device 101 is 67 to 112 degrees, may refer to an index value at 135 degrees when the folding angle of the electronic device 101 is 112 to 157 degrees, and may refer to an index value at 180 degrees when the folding angle of the electronic device 101 is 157 to 180 degrees. The above predetermined folding angles are merely one example, and the electronic device 101 may store, as an index value, an impedance value at an angle different from the above-mentioned angles. According to an embodiment, the electronic device 101 may apply a tuning code corresponding to a value approximated to be an index value.

According to an embodiment, the electronic device 101 may store a tuning code value corresponding to a predetermined folding angle. For example, the electronic device 101 may store impedance values when the folding angle is 0 degrees, 45 degrees, 90 degrees, 135 degrees, and 180 degrees, respectively, and tuning code values corresponding to the impedance values. In this case, the electronic device 101 may refer to and apply, based on the determined folding angle of the electronic device 101, a tuning code value corresponding to a most approximate angle. For example, the electronic device 101 may refer to a tuning code value at 0 degrees when the folding angle of the electronic device 101 is 0 to 22 degrees, may refer to a tuning code value at 45 degrees when the folding angle of the electronic device 101 is 22 to 67, may refer to a tuning code value at 90 degrees when the folding angle of the electronic device 101 is 67 to 112 degrees, may refer to a tuning code value at 135 degrees when the folding angle of the electronic device 101 is 112 to 157 degrees, and may refer to a tuning code value at 180 degrees when the folding angle of the electronic device 101 is 157 to 180 degrees. The above predetermined folding angles are merely one example, and the electronic device 101 may store a tuning code value at an angle different from the above-mentioned angles.

According to an embodiment, the electronic device 101 may store, as an index value, an impedance value corresponding to a predetermined withdrawn length. In one example, the case in which the maximum withdrawn length of the electronic device 101 is 10 cm may be provided as an example. For example, the electronic device 101 may store, as index values, impedance values when the withdrawn length is 0 cm, 2 cm, 4 cm, 6 cm, 8 cm, and 10 cm, respectively. In this case, the electronic device 101 may refer, based on the determined withdrawn length of the electronic device 101, to an index value corresponding to an angle having a most approximate value to obtain an approximation of an impedance value. For example, the electronic device 101 may refer to an index value at 0 cm when the withdrawn length of the electronic device 101 is 0 to 1 cm, may refer to an index value at 2 cm when the withdrawn length of the electronic device 101 is 1 to 3 cm, may refer to an index value at 4 cm when the withdrawn length of the electronic device 101 is 3 to 5 cm, may refer to an index value at 6 cm when the withdrawn length of the electronic device 101 is 5 to 7 cm, may refer to an index value at 8 cm when the withdrawn length of the electronic device 101 is 7 to 9 cm, and may refer to an index value at 10 cm when the withdrawn length of the electronic device 101 is 9 to 10 cm. The above predetermined withdrawn lengths are merely one example, and the electronic device 101 may store, as an index value, an impedance value at a length different from the above-mentioned lengths. According to an embodiment, the electronic device 101 may apply a tuning code corresponding to a value approximated to be an index value.

According to an embodiment, the electronic device 101 may store a tuning code value corresponding to a predetermined withdrawn length. For example, the electronic device 101 may store impedance values when the withdrawn length is 0 cm, 2 cm, 4 cm, 6 cm, 8 cm, and 10 cm, respectively, and tuning code values corresponding to the impedance values. In this case, the electronic device 101 may refer to and apply a tuning code value corresponding to a most approximate length, based on a determined withdrawn length of the electronic device 101. For example, the electronic device 101 may refer to a tuning code value at 0 cm when the withdrawn length of the electronic device 101 is 0 to 1 cm, may refer to a tuning code value at 2 cm when the withdrawn length of the electronic device 101 is 1 to 3 cm, may refer to a tuning code value at 4 cm when the withdrawn length of the electronic device 101 is 3 to 5 cm, may refer to a tuning code value at 6 cm when the withdrawn length of the electronic device 101 is 5 to 7 cm, may refer to a tuning code value at 8 cm when the withdrawn length of the electronic device 101 is 7 to 9 cm, and may refer to a tuning code value at 10 cm when the withdrawn length of the electronic device 101 is 9 to 10 cm. The above predetermined withdrawn lengths are merely one example, and the electronic device 101 may store a tuning code value at a length different from the above-mentioned lengths.

Figure 11:
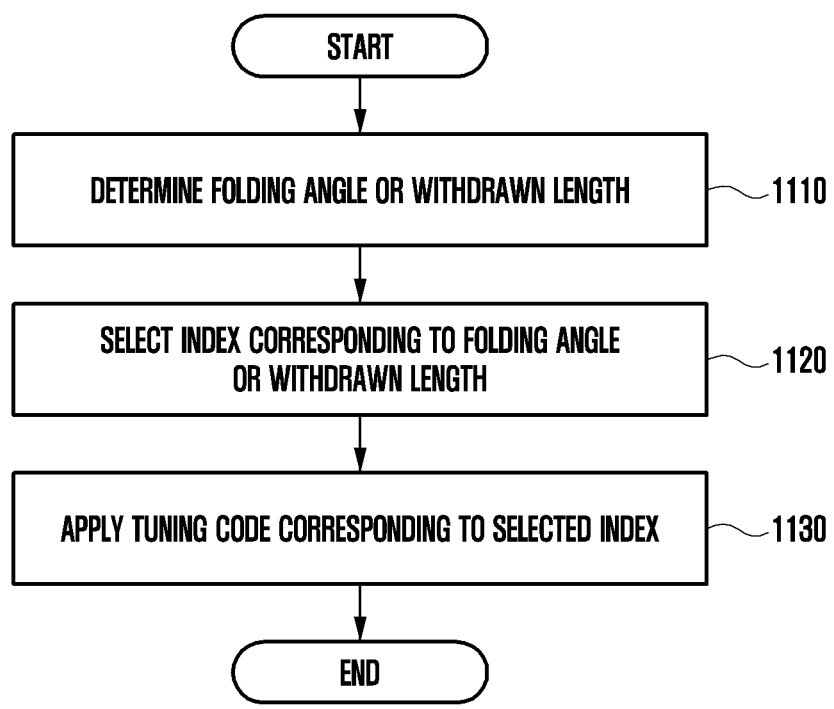
FIG. 11 is a flowchart showing operations of matching antenna impedance by an electronic device according to an embodiment of the disclosure.

FIG. 11 is a flowchart showing operations of matching antenna impedance by an electronic device matches according to an embodiment of the disclosure.

Referring to FIG. 11, operations in which an electronic device (e.g., the electronic device 101 in FIG. 5) matches impedance of an antenna (e.g., the antenna 530 in FIG. 5) may be described through a series of operations performed by a processor (e.g., the processor 120 in FIG. 1) of the electronic device 101. The order of each of the operations in FIG. 11 may be changed, or some operations may be replaced, changed, and/or added Referring to operation 1110, the processor 120 may determine a folding angle or a withdrawn length of the electronic device 101. The electronic device 101, for example, may be a foldable type electronic device (hereinafter, a foldable electronic device) like the electronic device 200 or 300 in FIG. 2 or 3. In another example, the electronic device 101 may be a rollable type electronic device (hereinafter, a rollable electronic device) like the electronic device 400 in FIG. 4. According to an embodiment, when the electronic device 101 is a foldable electronic device, the processor 120 may determine the folding angle (e.g., angle A in FIG. 2 or 3) of the electronic device 101. According to an embodiment, when the electronic device 101 is a rollable electronic device, the processor 120 may determine the withdrawn length (e.g., length A in FIG. 4) of the electronic device 101. According to various embodiments, the processor 120 may use the sensor module 176 to determine the folding angle of the electronic device 101. According to an embodiment, the processor 120 may determine the folding angle by using at least one among a gyro sensor, an acceleration sensor, and a magnetic sensor. The folding angle may be one among, for example, values of about 0 to about 180 degrees. In another example, the folding angle may be one of values of about 0 to about 360 degrees. According to an embodiment, the processor 120 may determine the withdrawn length of a second housing (e.g., the second housing 420 in FIG. 4). The withdrawn length may have, for example, 0 to a maximum withdrawn length (e.g., length B in FIG. 4). According to an embodiment, the processor 120 may periodically and/or continuously determine the folding angle or the withdrawn length of the electronic device 101.

Referring to operation 1120, the processor 120 may select an index corresponding to the folding angle or the withdrawn length. The index may be information in which multiple impedance values that the at least one antenna 530 may have are sampled. The processor 120 may select the index, based on the folding angle or the withdrawn length determined by using the sensor module 176 among multiple indices to select. According to an embodiment, the processor 120 may determine an impedance value of the antenna 530 corresponding to the folding angle or the withdrawn length, and may select an index corresponding to the determined impedance value. According to an embodiment, the processor 120 may select an index having a value most approximate to a real impedance value as an index corresponding to the real impedance value. The electronic device 101 may store information about multiple predetermined indices in a memory (e.g., the memory 130 in FIG. 1), and may store information about an impedance value corresponding to each index. The processor 120 may select a corresponding index, based on an impedance value corresponding to the folding angle or the withdrawn length. According to an embodiment, the memory 130 may store data related to the impedance value corresponding to the folding angle or the withdrawn length, and the processor 120 may determine the impedance value corresponding to the folding angle or the withdrawn length. The processor 120 may select, based on the determined impedance value, an index corresponding to the impedance value. According to an embodiment, the memory 130 may store data in which the folding angle or the withdrawn length is mapped to an index, and the processor 120 may select a corresponding index, based on the determined the folding angle or the withdrawn length.

Referring to operation 1130, the processor 120 may apply a tuning code corresponding to the selected index. The tuning code may be information corresponding to the index. For example, the processor 120 may apply the tuning code to an antenna tuner (e.g., the antenna tuner 520 in FIG. 5). According to various embodiments, the processor 120 may apply the tuning code corresponding to the selected index to the antenna tuner 520. The processor 120 may control the antenna tuner 520, based the tuning code corresponding to the selected index. According to an embodiment, the processor 120 may control the antenna tuner 520 to activate or deactivate at least some among at least one of one or more inductors, one or more capacitors, or one or more resistors, included in the antenna tuner 520. The processor 120 may control an element (e.g., the inductor, the capacitor, or the resistor) of the antenna tuner 520 to match impedance of the antenna 530.

Figure 12:
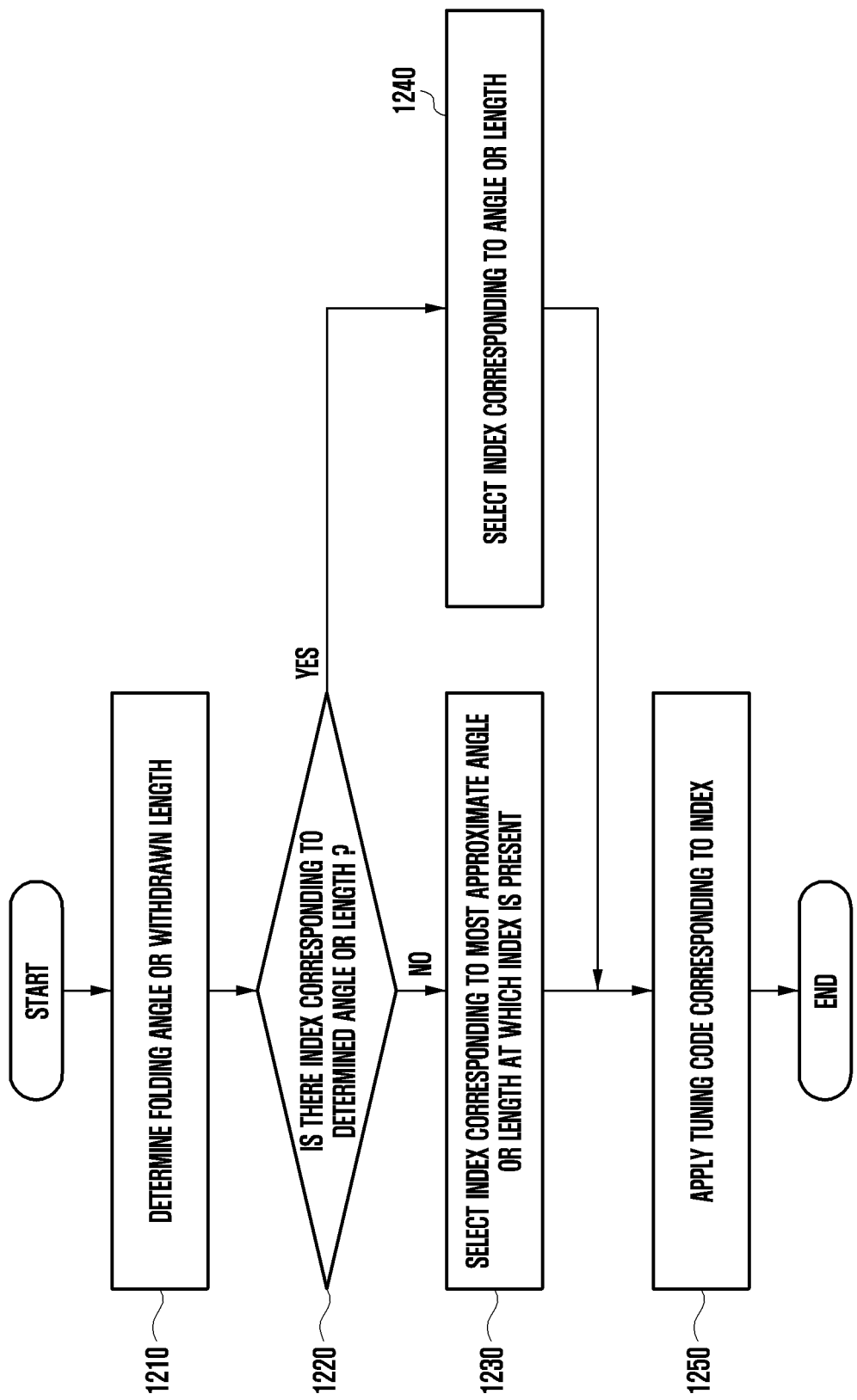
FIG. 12 is a flowchart showing operations in which an electronic device matches antenna impedance by approximating the antenna impedance to an index value according to an embodiment of the disclosure.

FIG. 12 is a flowchart showing operations in which an electronic device matches antenna impedance by approximating the antenna impedance to an index value according to an embodiment of the disclosure.

Referring to FIG. 12, operations in which an electronic device (e.g., the electronic device 101 in FIG. 5) matches impedance of an antenna (e.g., the antenna 530 in FIG. 5) may be described through a series of operations performed by a processor (e.g., the processor 120 in FIG. 1) of the electronic device 101. The order of each of operations in FIG. 12 may be changed, or some operations may be replaced, changed, and/or added.

Referring to operation 1210, the processor 120 may determine a folding angle or a withdrawn length of the electronic device 101. The electronic device 101, for example, may be a foldable type electronic device (hereinafter, a foldable electronic device) like the electronic device 200 or 300 in FIG. 2 or 3. In another example, the electronic device 101 may be a rollable type electronic device (hereinafter, a rollable electronic device) like the electronic device 400 in FIG. 4. According to an embodiment, when the electronic device 101 is a foldable electronic device, the processor 120 may determine the folding angle (e.g., angle A in FIG. 2 or 3) of the electronic device 101. According to an embodiment, when the electronic device 101 is a rollable electronic device, the processor 120 may determine the withdrawn length (e.g., length A in FIG. 4) of the electronic device 101. According to various embodiments, the processor 120 may use the sensor module 176 to determine the folding angle of the electronic device 101. According to an embodiment, the processor 120 may determine the folding angle by using at least one among a gyro sensor, an acceleration sensor, and a magnetic sensor. The folding angle may be one among, for example, values of about 0 to about 180 degrees. In another example, the folding angle may be one of values of about 0 to about 360 degrees. According to an embodiment, the processor 120 may determine the withdrawn length of a second housing (e.g., the second housing 420 in FIG. 4). The withdrawn length may have, for example, 0 to a maximum withdrawn length (e.g., length B in FIG. 4). According to an embodiment, the processor 120 may periodically and/or continuously determine the folding angle or the withdrawn length of the electronic device 101.

Referring to operation 1220, the processor 120 may determine whether there is an index corresponding to the determined angle or length. For example, the determined angle or length may have a continuous value, and there may be no corresponding index. The memory 130 of the electronic device 101 may store only an index corresponding to a predetermined angle (e.g., 0 degrees, 60 degrees, 120 degrees, and 180 degrees) or a predetermined length, and the processor 120 may determine whether the index corresponding to the determined angle or length is stored in the memory 130. The processor 120 may proceed to operation 1240 when there is an index corresponding to the determined angle or length, and may proceed to operation 1230 when there is no index corresponding to the determined angle or length.

Referring to operation 1230, when there is no index corresponding to the determined angle or length, the processor 120 may determine a most approximate angle or length having a corresponding index, and may select an index corresponding to the determined angle or angle. For example, when the folding angle determined by the processor 120 is 50 degrees, and when the electronic device 101 stores only information about an index corresponding to 0 degrees and an index corresponding to 60 degrees, the processor 120 may select 60 degrees, which is most approximate to 50 degrees, from among 0 degrees and 60 degrees, and may select an index corresponding to the selected 60 degrees.

According to an embodiment, the processor 120 may store, as an index value, an impedance value corresponding to a predetermined folding angle. For example, the processor 120 may store, as index values, impedance values when the folding angle is 0 degrees, 45 degrees, 90 degrees, 135 degrees, and 180 degrees, respectively. In this case, the processor 120 may refer, based on the determined folding angle of the electronic device 101, to an index value corresponding to an angle having a most approximate value to obtain an approximation of an impedance value. For example, the processor 120 may refer to an index value at 0 degrees when the folding angle of the electronic device 101 is 0 to 22 degrees, may refer to an index value at 45 degrees when the folding angle of the electronic device 101 is 22 to 67 degrees, may refer to an index value at 90 degrees when the folding angle of the electronic device 101 is 67 to 112 degrees, may refer to an index value at 135 degrees when the folding angle of the electronic device 101 is 112 to 157 degrees, and may refer to an index value at 180 degrees when the folding angle of the electronic device 101 is 157 to 180 degrees. The above predetermined folding angles are merely one example, and the processor 120 may store, as an index value, an impedance value at an angle different from the above-mentioned angles. According to an embodiment, the processor 120 may apply a tuning code corresponding to a value approximated to be an index value.

According to an embodiment, the processor 120 may store a tuning code value corresponding to a predetermined folding angle. For example, the processor 120 may store impedance values when the folding angle is 0 degrees, 45 degrees, 90 degrees, 135 degrees, and 180 degrees, respectively, and tuning code values corresponding to the impedance values. In this case, the processor 120 may refer to and apply, based on the determined folding angle of the electronic device 101, a tuning code value corresponding to a most approximate angle. For example, the processor 120 may refer to a tuning code value at 0 degrees when the folding angle of the electronic device 101 is 0 to 22 degrees, may refer to a tuning code value at 45 degrees when the folding angle of the electronic device 101 is 22 to 67, may refer to a tuning code value at 90 degrees when the folding angle of the electronic device 101 is 67 to 112 degrees, may refer to a tuning code value at 135 degrees when the folding angle of the electronic device 101 is 112 to 157 degrees, and may refer to a tuning code value at 180 degrees when the folding angle of the electronic device 101 is 157 to 180 degrees. The above predetermined folding angles are mere one example, and the processor 120 may store a tuning code value at an angle different from the above-mentioned angles.

According to an embodiment, the processor 120 may store, as an index value, an impedance value corresponding to a predetermined withdrawn length. In one example, the case in which the maximum withdrawn length of the electronic device 101 is 10 cm may be provided as an example. For example, the processor 120 may store, as index values, impedance values when the withdrawn length is 0 cm, 2 cm, 4 cm, 6 cm, 8 cm, and 10 cm, respectively. In this case, the processor 120 may refer, based on the determined withdrawn length of the electronic device 101, to an index value corresponding to an angle having a most approximate value to obtain an approximation of an impedance value. For example, the processor 120 may refer to an index value at 0 cm when the withdrawn length of the electronic device 101 is 0 to 1 cm, may refer to an index value at 2 cm when the withdrawn length of the electronic device 101 is 1 to 3 cm, may refer to an index value at 4 cm when the withdrawn length of the electronic device 101 is 3 to 5 cm, may refer to an index value at 6 cm when the withdrawn length of the electronic device 101 is 5 to 7 cm, may refer to an index value at 8 cm when the withdrawn length of the electronic device 101 is 7 to 9 cm, and may refer to an index value at 10 cm when the withdrawn length of the electronic device 101 is 9 to 10 cm. The above predetermined withdrawn lengths are merely one example, and the processor 120 may store, as an index value, an impedance value at a length different from the above-mentioned lengths. According to an embodiment, the processor 120 may apply a tuning code corresponding to a value approximated to be an index value.

According to an embodiment, the processor 120 may store a tuning code value corresponding to a predetermined withdrawn length. For example, the processor 120 may store impedance values when the withdrawn length is 0 cm, 2 cm, 4 cm, 6 cm, 8 cm, and 10 cm, respectively, and tuning code values corresponding to the impedance values. In this case, the processor 120 may refer to and apply a tuning code value corresponding to a most approximate length, based on a determined withdrawn length of the electronic device 101. For example, the processor 120 may refer to a tuning code value at 0 cm when the withdrawn length of the electronic device 101 is 0 to 1 cm, may refer to a tuning code value at 2 cm when the withdrawn length of the electronic device 101 is 1 to 3 cm, may refer to a tuning code value at 4 cm when the withdrawn length of the electronic device 101 is 3 to 5 cm, may refer to a tuning code value at 6 cm when the withdrawn length of the electronic device 101 is 5 to 7 cm, may refer to a tuning code value at 8 cm when the withdrawn length of the electronic device 101 is 7 to 9 cm, and may refer to a tuning code value at 10 cm when the withdrawn length of the electronic device 101 is 9 to 10 cm. The above predetermined withdrawn lengths are merely one example, and the processor 120 may store a tuning code value at a length different from the above-mentioned lengths.

Referring to operation 1240, when there is an index corresponding to the determined angle or length, the processor 120 may select the corresponding index.

Referring to operation 1250, the processor 120 may apply a tuning code corresponding to the selected index. The tuning code may be information corresponding to the index. For example, the processor 120 may apply a tuning code to an antenna tuner (e.g., the antenna tuner 520 in FIG. 5). According to various embodiments, the processor 120 may apply the tuning code corresponding to the selected index to the antenna tuner 520. The processor 120 may control the antenna tuner 520, based on the tuning code corresponding to the selected index. According to an embodiment, the processor 120 may control the antenna tuner 520 to activate or deactivate at least some among at least one of one or more inductors, one or more capacitors, or one or more resistors, included in the antenna tuner 520. The processor 120 may control an element (e.g., the inductor, the capacitor, or the resistor) of the antenna tuner 520 to match impedance of the antenna 530.

Referring Table 1 below, the impedance matching method disclosed herein and the degree of antenna performance improvement according to the folding angle of the electronic device 101 using the same may be shown. Referring to Table 1, for example, values regarding antenna signal characteristics before and after improvement, experimentally measured by using antennas (e.g., Ant 1, Ant 2, Ant 3, Ant 4, and Ant 5) attached to parts of the electronic device 101, may be identified. The values regarding the antenna signal characteristics may include measurement values of total radiated power (TRP) and total isotropic sensitivity (TIS). Furthermore, difference values between before and after improvement may be determined by improvement values. Referring to Table 1, after improvement, improvement values may be determined to be averagely 0.6 dB to 1.6 dB.

TABLE 1

| | | Ant 1 | | Ant 2 | | Ant 3 | | Ant 4 | | Ant 5 | |
|---|---|---|---|---|---|---|---|---|---|---|---|
| | | TRP | TIS | TRP | TIS | TRP | TIS | TRP | TIS | TRP | TIS |
| 0 degrees (dBm) | | 16.63 | 93.21 | 17.80 | 93.79 | 17.89 | 94.28 | 20.41 | 97.18 | 20.61 | 95.98 |
| 45 degrees | Before improvement (Bm) | 14.86 | 91.54 | 16.07 | 92.49 | 16.33 | 93.46 | 19.15 | 96.09 | 19.34 | 94.67 |
| | After improvement (dBm) | 16.48 | 92.75 | 17.38 | 93.83 | 17.60 | 94.36 | 20.36 | 97.38 | 20.77 | 95.96 |
| | Improvement value (dB) | 1.62 | 1.21 | 1.31 | 1.34 | 1.27 | 0.90 | 1.21 | 1.29 | 1.43 | 1.29 |
| 90 degrees | Before improvement (dBm) | 14.69 | 91.01 | 15.70 | 92.15 | 15.71 | 92.38 | 18.86 | 95.62 | 18.96 | 94.03 |
| | After improvement (dBm) | 16.22 | 92.38 | 17.08 | 93.50 | 17.25 | 93.53 | 20.32 | 97.033 | 20.51 | 95.64 |
| | Improvement value (dB) | 1.53 | 1.37 | 1.38 | 1.35 | 1.54 | 1.15 | 1.46 | 1.41 | 1.55 | 1.61 |
| 135 degrees | Before improvement (dBm) | 15.32 | 91.78 | 16.57 | 92.69 | 16.21 | 92.89 | 18.92 | 96.25 | 19.79 | 95.01 |
| | After improvement (dBm) | 16.52 | 92.65 | 17.34 | 93.84 | 17.59 | 93.75 | 20.31 | 97.32 | 20.75 | 95.88 |
| | Improvement value (dB) | 1.20 | 1.87 | 0.77 | 1.15 | 1.38 | 0.86 | 1.39 | 1.07 | 0.96 | 0.87 |
| 180 degrees (dBm) | | 17.32 | 93.73 | 18.54 | 94.39 | 18.40 | 94.61 | 20.77 | 97.63 | 20.94 | 96.28 |

Figure 13:
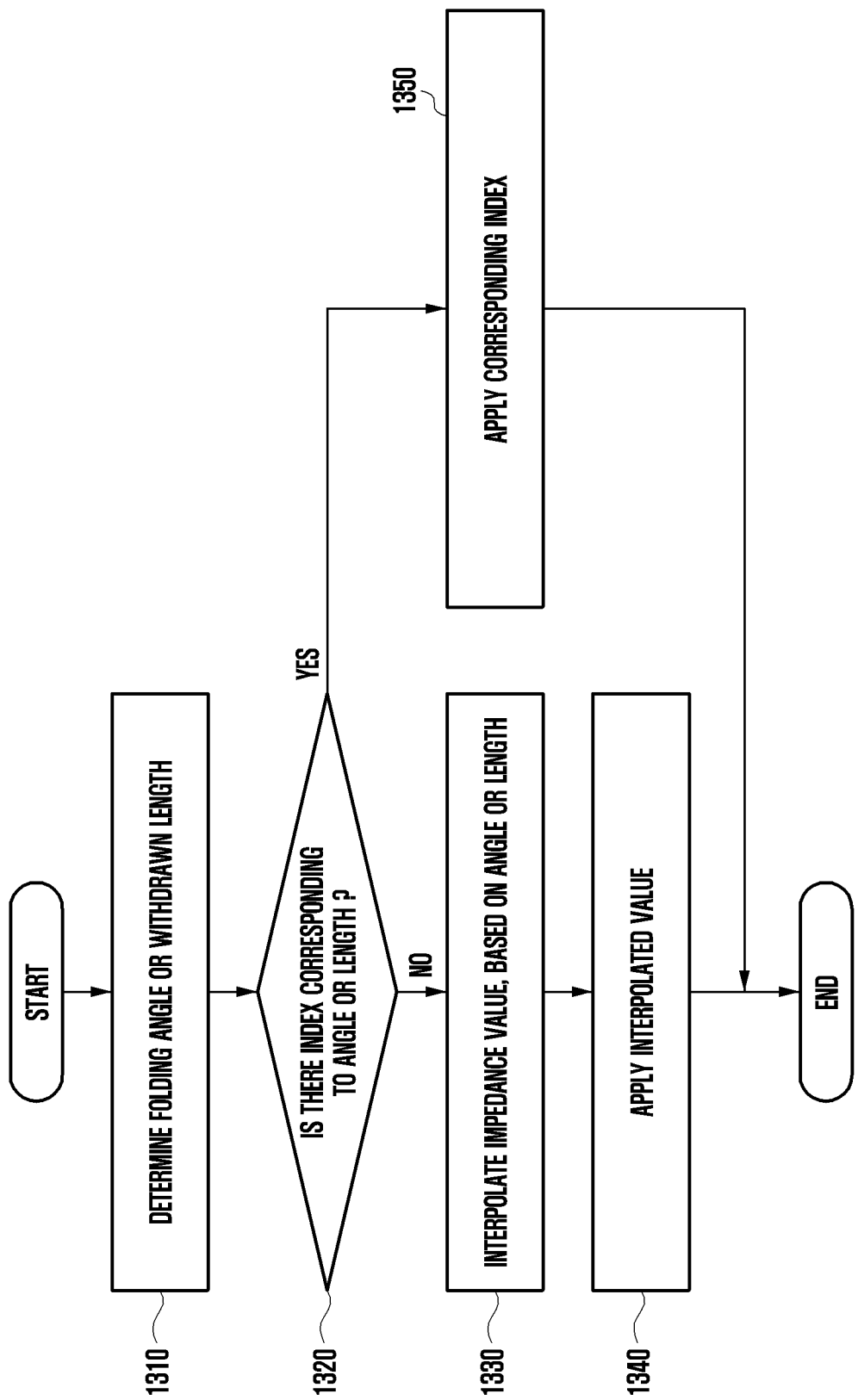
FIG. 13 is a flowchart showing operations in which an electronic device matches antenna impedance by using an interpolated value according to an embodiment of the disclosure.

FIG. 13 is a flowchart showing operations in which an electronic device matches antenna impedance by using an interpolated value according to an embodiment of the disclosure.

Referring to FIG. 13, operations in which an electronic device (e.g., the electronic device 101 in FIG. 5) matches impedance of an antenna (e.g., the antenna 530 in FIG. 5) may be described through a series of operations formed by a processor (e.g., the processor 120 in FIG. 1) of the electronic device 101. The order of each of operations in FIG. 13 may be changed, or some operations may be replaced, changed, and/or added.

Referring to operation 1310, the processor 120 may determine a folding angle or a withdrawn length of the electronic device 101. The electronic device 101, for example, may be a foldable type electronic device (hereinafter, a foldable electronic device) like the electronic device 200 or 300 in FIG. 2 or 3. In another example, the electronic device 101 may be a rollable type electronic device (hereinafter, a rollable electronic device) like the electronic device 400 in FIG. 4. According to an embodiment, when the electronic device 101 is a foldable electronic device, the processor 120 may determine the folding angle (e.g., angle A in FIG. 2 or 3) of the electronic device 101. According to an embodiment, when the electronic device 101 is a rollable electronic device, the processor 120 may determine the withdrawn length (e.g., length A in FIG. 4) of the electronic device 101. According to various embodiments, the processor 120 may use the sensor module 176 to determine the folding angle of the electronic device 101. According to an embodiment, the processor 120 may determine the folding angle by using at least one among a gyro sensor, an acceleration sensor, and a magnetic sensor. The folding angle may be one among, for example, values of about 0 to about 180 degrees. In another example, the folding angle may be one of values of about 0 to about 360 degrees. According to an embodiment, the processor 120 may determine the withdrawn length of a second housing (e.g., the second housing 420 in FIG. 4). The withdrawn length may have, for example, 0 to a maximum withdrawn length (e.g., length B in FIG. 4). According to an embodiment, the processor 120 may periodically and/or continuously determine the folding angle or the withdrawn length of the electronic device 101.

Referring to operation 1320, the processor 120 may determine whether there is an index corresponding to the determined angle or length. For example, the determined angle or length may have a continuous value, and there may be no corresponding index. The memory 130 of the electronic device 101 may store only an index corresponding to a predetermined angle (e.g., 0 degrees, 60 degrees, 120 degrees, and 180 degrees) or a predetermined length, and the processor 120 may determine whether an index corresponding to the determined angle or length is stored in the memory 130. The processor 120 may proceed to operation 1350 when there is an index corresponding to the determined angle or length, and may proceed to operation 1330 when there is no index corresponding to the determined angle or length.

Referring to operation 1330, the processor 120 may interpolate an impedance value, based on the determined angle or length. When there is no index corresponding to the determined angle or length, the processor 120 may interpolate an impedance value by using an angle or length having a corresponding index and the determined angle or length. The processor 120 may determine an interpolation ratio, and may interpolate an impedance value, based on the interpolation ratio. According to an embodiment, the interpolation ratio may be determined based on a ratio in which the determined angle internally divides at least two angles having corresponding indices. According to an embodiment, the processor 120 may acquire an interpolated value by applying the interpolation ratio to two or more index values. For example, when the electronic device 101 stores only indices corresponding to 0 degrees and 180 degrees, the processor 120 may interpolate the index corresponding to 0 degrees and the index corresponding to 180 degrees, based on a ratio in which a determined angle (e.g., angle A) internally divides 0 degrees and 180 degrees. According to an embodiment, a value interpolated and acquired by the processor 120 may be deemed to be an impedance value of the antenna 530 corresponding to the determined angle. According to an embodiment, the interpolation ratio may be determined based on a ratio in which the determined length internally divides two or more lengths having corresponding indices. According to an embodiment, the processor 120 may acquire an interpolated value by applying the interpolation ratio to two or more index values. For example, when the electronic device 101 stores only indices corresponding to 0 cm and 10 cm, the processor 120 may interpolate the index corresponding to 0 cm and the index corresponding to 10 cm, based on a ratio in which a determined length (e.g., length A) internally divides 0 cm and 10 cm. According to an embodiment, a value interpolated and acquired by the processor 120 may be deemed to be an impedance value of the antenna 530 corresponding to the determined length. According to an embodiment, the processor 120 may linearly interpolate each index value. For example, the processor 120 may store the Smith chart and data in which an impedance value corresponding to each region of the Smith chart is mapped, and may linearly interpolate the impedance value, based on the Smith chart, an index value, and an interpolation ratio.

Referring to operation 1340, the processor 120 may apply the interpolated impedance value. According to an embodiment, the processor 120 may determine an index corresponding to the interpolated impedance value (e.g., the interpolated value). For example, the processor 120 may determine an index nearest to the interpolated value. The processor 120 may apply the index nearest to the interpolated value to the antenna tuner 520 to perform impedance matching.

Referring to operation 1350, when there is an index corresponding to the determined angle or length, the processor 120 may select the corresponding index. The processor 120 may apply a tuning code corresponding to the selected index. The tuning code may be information corresponding to the index. For example, the processor 120 may apply a tuning code to an antenna tuner (e.g., the antenna tuner 520 in FIG. 5). According to various embodiments, the processor 120 may apply the tuning code corresponding to the selected index to the antenna tuner 520. The processor 120 may control the antenna tuner 520, based on the tuning code corresponding to the selected index. According to an embodiment, the processor 120 may control the antenna tuner 520 to activate or deactivate at least some among at least one of one or more inductors, one or more capacitors, or one or more resistors, included in the antenna tuner 520. The processor 120 may control an element (e.g., the inductor, the capacitor, or the resistor) of the antenna tuner 520 to match impedance of the antenna 530.

Figure 14:
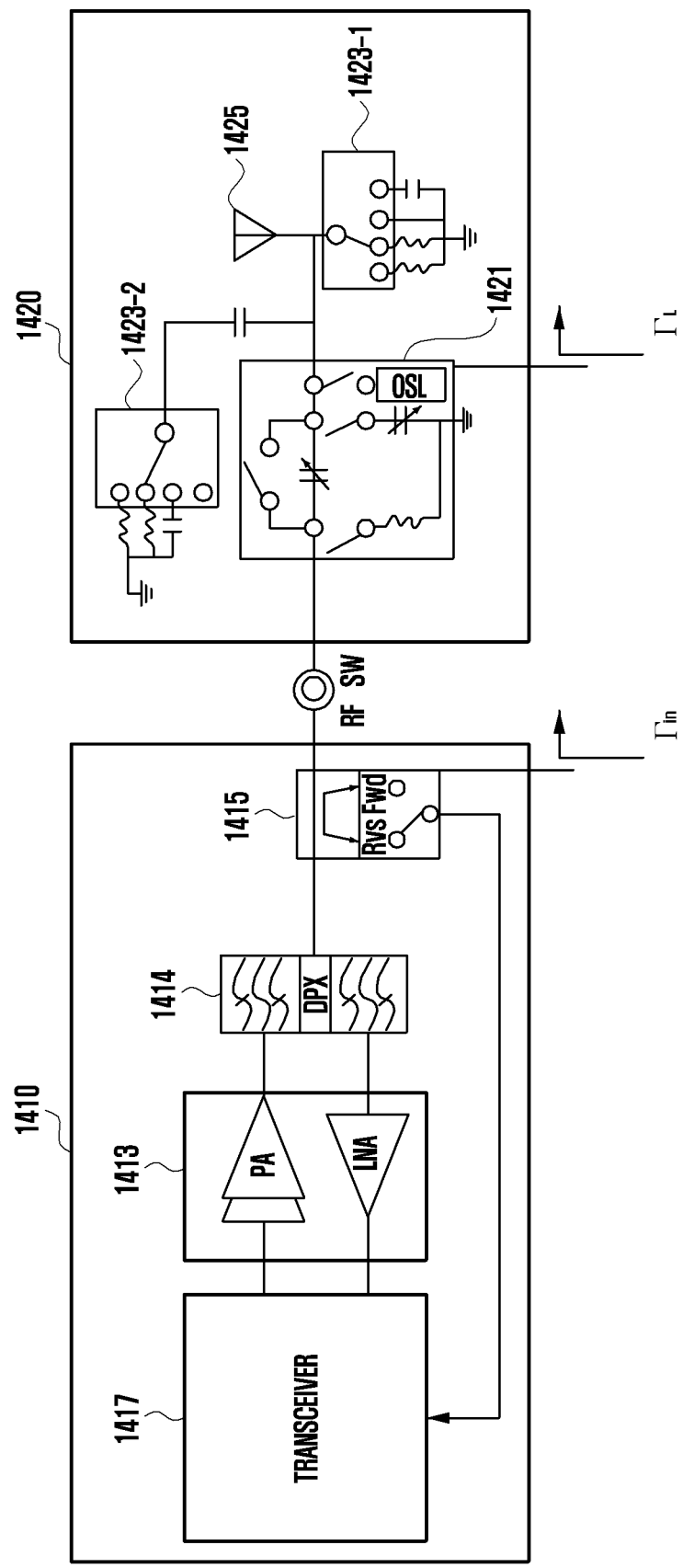
FIG. 14 is a block diagram of an electronic device according to an embodiment of the disclosure.

FIG. 14 is a block diagram of an electronic device according to an embodiment of the disclosure.

Referring to FIG. 14, the electronic device 101 may include a communication module 1410 (e.g., the communication module 190 in FIG. 1), and antenna module 1420 (e.g., the antenna module 197 in FIG. 1).

According to an embodiment, the communication module 1410 may include a phase modulator 1414, a power amplifier 1413, a coupler 1415, and a transceiver 1417. According to an embodiment, the antenna module 1420 may include an antenna tuner 1421, at least one ground controller 1423-1 or 1423-2, and an antenna 1425.

According to an embodiment, a processor (not shown) (e.g., the processor 120 in FIG. 1 or the processor 120 in FIG. 5) may transmit and/or receive a signal to and/or from other elements (e.g., the phase modulator 1414, the power amplifier 1413, the coupler 1415, and the transceiver 1417), and may control operations thereof or may perform calculation and/or processing of various types of data. In an example, the processor may include a communication processor (CP) or an application processor (AP).

According to an embodiment, a transmission signal amplified by the power amplifier 1413 may be transferred to the antenna tuner 1421 through the transceiver and phase modulator 1414, and may be transmitted through the antenna 1425.

According to an embodiment, a reception signal received through the antenna 1425 may be phase-modulated in the phase modulator 1414 through the antenna tuner 1421, may be amplified in the power amplifier 1413, and transferred to the transceiver 1417.

According to an embodiment, a ground controller 1423 may adjust the length of the antenna 1425. For example, the ground controller 1423 may include at least one switch, and may control an operation of the at least one switch, based on a ground code that is input from the processor. The length of the antenna 1425 may be changed depending on the state of connection of the at least one switch.

According to an embodiment, the processor may control the at least one ground controller 1423-1 or 1423-2 based on a communication frequency. For example, the processor 120 may control the at least one ground controller 1423-1 or 1423-2 to adjust the length of the antenna 1425. Here, two ground controllers 1423-1 and 1423-2 are adopted, but this is one example. One or multiple ground controllers may be adopted.

According to an embodiment, the processor may control the at least one ground controller 1423-1 or 1423-2 in order to match impedance of the antenna 1425 based on a communication frequency. For example, the processor may fix a tuning code of the tuner 1421 as a reference tuning code, and may calculate a current antenna load (or antenna impedance) by receiving a feedback signal (e.g., a forward coupling signal or a reverse coupling signal) from the coupler 1415 while changing a ground code of the at least one ground controller 1423-1 or 1423-2. The coupler 1415 may be coupled to a signal line between the power amplifier 1413 and the antenna tuner 1421, and may output a feedback signal corresponding to a communication signal and transmit the feedback signal to the processor. The processor may determine an input reflection coefficient Γin in which the antenna 1425 is observed from an input of the tuner 1421 through a reverse and forward voltage ratio of the feedback signal.

According to an embodiment, the tuning code of the tuner 1421 may be fixed as a reference tuning code, and a feedback signal may be received from the coupler 1415 while a ground code of the at least one ground controller 1423-1 or 1423-2 is changed, and a ground code having a smallest input reflection coefficient Γin may be configured to be a reference ground code.

According to an embodiment, an optimum ground code may be selected according to various use conditions, based on the reference ground code.

Figure 15:
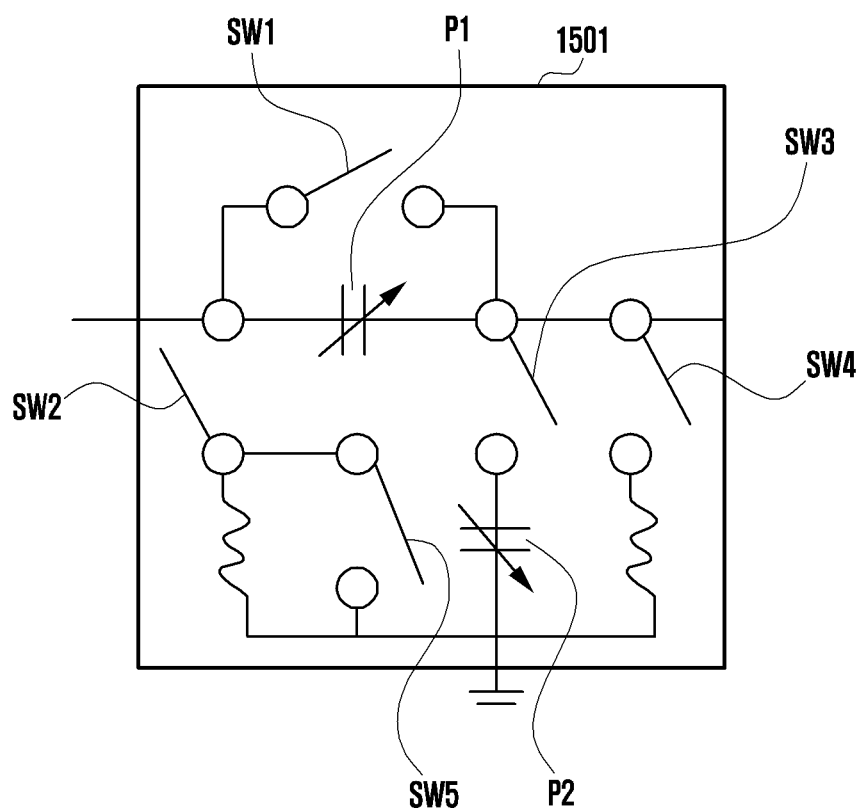
FIG. 15 illustrates elements of an antenna tuner of an electronic device according to an embodiment of the disclosure.

FIG. 15 illustrates elements of an antenna tuner (e.g., the antenna tuner 520 in FIG. 5 or the antenna tuner 1421 in FIG. 14) of an electronic device (e.g., the electronic device 101 in FIG. 5) according to an embodiment of the disclosure.

Referring to FIG. 15, the antenna tuner 520 may include an impedance control circuit 1501. The impedance control circuit 1501 may include at least one switch (e.g., SW1, SW2, SW3, SW4, or SW5) and at least one passive element (e.g., a variable capacitor or inductor) P1 or P2. According to an embodiment, the antenna tuner 520 may operate (e.g., turn on or turn off) each of the switches in response to a tuning code that is input from a processor (e.g., the processor 120 in FIG. 5). When a tuning code is received from a communication processor (e.g., the processor 120 in FIG. 5), the at least one switch operates, and impedance of an antenna (e.g., the antenna 530 in FIG. 5) may be determined based on the connection state of the at least one passive element. The number of switches and the number and the connection structure of passive elements, in FIG. 5, are one example, and various modifications may be possible.

According to an embodiment, under control of the processor 120, the impedance control circuit 1501 of the antenna tuner 520 may apply a reference ground code and a reference tuning code as tunable codes, respectively, may measure an input reflection coefficient Γin through a coupler (e.g., the coupler 1415 in FIG. 14), and may determine an output reflection coefficient Γl by using reference S-parameters of the antenna tuner 520.

According to an embodiment, at the time of measuring the entire range of the S-parameter according to electrical characteristics of the antenna tuner 520, in a primary example, a list of 16384 S-parameters may be generated, and in some examples secondarily selected therefrom, a list of 1536 S-parameters may be stored in a memory (e.g., the memory 130 in FIG. 1).

According to an embodiment, in a thirdly example based on an operation of at least one element, 96 (64+32) or fewer S-parameters according to electrical characteristics of the antenna tuner 520 may be selected.

According to an embodiment, when the structure of elements of the impedance control circuit 1501 of the antenna tuner 520 is examined, at the time of turning-on or turning-off of a first switch SW1, which is a serial switch, switches SW2, SW3, and SW4 connected thereto in parallel and a value of an input reflection coefficient Γin according to a change of a second variable capacitor P2, for example, the presence and absence of a change in phase may vary. For example, when the first switch SW1 is turned on, the input reflection coefficient Γin may not change even when a value of a first variable capacitor P1 connected thereto in series changes. In contrast, when the first switch SW1 is turned off, the phase of the input reflection coefficient Γin may change provided that there is a change in each of a value of the first variable capacitor P1 connected thereto in series and values of the switches SW2, SW3, and SW4 and the second variable capacitor connected thereto in parallel.

An electronic device according to various embodiments disclosed herein may include a housing structure including a first housing and a second housing connected to first housing, the second housing being connected to the first housing so as to be slidable while being at least partially inserted into or withdrawn from the first housing, a sensor module including at least one sensor, an antenna, an antenna tuner electrically connected to the antenna and configured to match impedance of the antenna, and a processor operatively connected to the sensor module, the antenna, and the antenna tuner, wherein the processor is configured to determine withdrawal information about a withdrawn degree of the second housing by using the sensor module, select an index corresponding to the withdrawal information from among multiple indices in which impedance values of the antenna according to multiple different pieces of withdrawal information are sampled, and control, based on a tuning code corresponding to the selected index, the antenna tuner to activate or deactivate at least some among at least one of one or more capacitors or one or more inductors included in the antenna tuner, so as to match the impedance of the antenna.

Furthermore, the electronic device may include a memory configured to store a first index, which is an impedance value of the antenna corresponding to a first withdrawn length, and a second index, which is an impedance value of the antenna corresponding to a second withdrawn length, wherein the processor is configured to select, when a withdrawn length corresponding to the determined withdrawal information is between the first withdrawn length and the second withdrawn length, an interpolated value obtained by interpolating the first index and the second index as antenna impedance, and match the impedance of the antenna, based on a tuning code corresponding to the selected interpolated value.

Furthermore, the processor may be configured to select the interpolated value by linearly interpolating the first index and the second index, based on a ratio in which the withdrawn length corresponding to the determined withdrawal information internally divides the first withdrawn length and the second withdrawn length.

Furthermore, the memory may be configured to store an impedance graph and values corresponding to the multiple indices on the impedance graph, and the processor may be configured to interpolate the first index and the second index, based on the impedance graph.

Furthermore, the processor may be configured to select, when a withdrawn length corresponding to the determined withdrawal information is between a first withdrawn length and a second withdrawn length, a withdrawn length more approximate to the withdrawn length corresponding to the determined withdrawal information from among the first withdrawn length and the second withdrawn length, and select an index corresponding to the selected withdrawn length from among a first index corresponding to the first withdrawn length and a second index corresponding to the second withdrawn length.

Furthermore, the indices may be impedance values of the antenna, which are sampled with regard to multiple withdrawn lengths having different sizes with reference to the withdrawn degree of the second housing.

Furthermore, the indices may be impedance values of the antenna, which are sampled based on a predetermined withdrawn length interval of the second housing.

Furthermore, each of the multiple indices corresponding to the withdrawal information may be an impedance value obtained by linearly interpolating, based on a ratio in which a withdrawn length of the second housing internally divides 0 to 180 degrees, a first reference value, which is an antenna impedance value at the 0 degrees, and a second reference value, which is an antenna impedance value at the 180 degrees.

Furthermore, the electronic device may further include a memory configured to store mapping information in which the withdrawal information, an index corresponding to the withdrawal information, and a tuning code corresponding to the index are mapped, and the processor may be configured to control the antenna tuner, based on the determined withdrawal information and the mapping information.

An electronic device according to various embodiments disclosed herein may include a housing structure including a hinge part, a first housing, and a second housing connected to the first housing through the hinge part, the first housing and the second housing being connected to each other so as to be folded or unfolded with reference to the hinge part, a sensor module including at least one sensor, an antenna, an antenna tuner electrically connected to the antenna and configured to match impedance of the antenna, and a processor operatively connected to the sensor module, the antenna, and the antenna tuner, wherein the processor is configured to determine, using the sensor module, folding information about a degree by which the first housing and the second housing are folded, select an index corresponding to the folding information from among multiple indices in which impedance values of the antenna according to multiple different pieces of folding information are sampled, and control, based on a tuning code corresponding to the selected index, the antenna tuner to activate or deactivate at least some among at least one of one or more capacitors or one or more inductors included in the antenna tuner, so as to match the impedance of the antenna.

Furthermore, the electronic device may further include a memory configured to store mapping information in which a folding angle corresponding to the folding information, an index corresponding to the folding angle, and a tuning code corresponding to the index are mapped, and the processor may be configured to control the antenna tuner, based on the determined folding information and the mapping information.

A method performed by an electronic device including a first housing and a second housing connected to the first housing so as to be at least partially insertable into or withdrawable from the first housing, according to various embodiments disclosed herein, may include determining withdrawal information about a withdrawn degree of the second housing, selecting an index corresponding to the withdrawal information from among multiple indices in which impedance values of an antenna of the electronic device according to multiple different pieces of withdrawal information are sampled, and controlling, based on a tuning code corresponding to the selected index, an antenna tuner to activate or deactivate at least some among at least one of one or more capacitors or one or more inductors included in the antenna tuner, so as to match impedance of the antenna.

Furthermore, the selecting of the index corresponding to the withdrawal information may include selecting, when a withdrawn length corresponding to the determined withdrawal information is between a first withdrawn length and a second withdrawn length, an interpolated value, obtained by interpolating a first index corresponding to the first withdrawn length and a second index corresponding to the second withdrawn length, as antenna impedance, and selecting an index corresponding to the selected interpolated value.

Furthermore, the selecting of the interpolated value as antenna impedance may include selecting the interpolated value by linearly interpolating the first index and the second index, based on a ratio in which the withdrawn length corresponding to the determined withdrawal information internally divides the first withdrawn length and the second withdrawn length.

Furthermore, the selecting of the indices may include selecting, when a withdrawn length corresponding to the determined withdrawal information is between a first withdrawn length and a second withdrawn length, a withdrawn length more approximate to the withdrawn length corresponding to the determined withdrawal information from among the first withdrawn length and the second withdrawn length, and selecting an index corresponding to the selected withdrawn length from among a first index corresponding to the first withdrawn length and a second index corresponding to the second withdrawn length.

Furthermore, the indices may be impedance values of the antenna, which are sampled with regard to multiple withdrawn lengths having different sizes with reference to the withdrawn degree of the second housing.

Furthermore, the indices may be impedance values of the antenna, which are sampled based on a predetermined withdrawn length interval of the second housing.

Furthermore, each of the multiple indices corresponding to the withdrawal information may be an impedance value obtained by linearly interpolating, based on a ratio in which a withdrawn length of the second housing internally divides 0 to 180 degrees, a first reference value, which is an antenna impedance value at the 0 degrees, and a second reference value, which is an antenna impedance value at the 180 degrees.

A method performed by an electronic device including a first housing and a second housing connected to each other so as to be folded or unfolded, according to various embodiments disclosed herein, may include determining folding information about a degree by which the first housing and the second housing are folded, selecting an index corresponding to the folding information from among multiple indices in which impedance values of an antenna of the electronic device are sampled according to multiple different pieces of folding information, and controlling, based on a tuning code corresponding to the selected index, an antenna tuner to activate or deactivate at least some among at least one of one or more capacitors or one or more inductors included in the antenna tuner, so as to match impedance of the antenna.

Furthermore, the electronic device may store mapping information in which a folding angle corresponding to the folding information, an index corresponding to the folding angle, and a tuning code corresponding to the index are mapped, and the matching of the impedance of the antenna may include controlling the antenna tuner, based on the determined folding information and the stored mapping information.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via a third element.

As used in various embodiments of the disclosure, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities, and some of the multiple entities may be separately disposed in any other element. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing structure comprising a first housing and a second housing connected to the first housing, the second housing being connected to the first housing so as to be slidable while being at least partially inserted into or withdrawn from the first housing;
    a sensor module comprising at least one sensor;
    an antenna;
    an antenna tuner electrically connected to the antenna and configured to match impedance of the antenna; and
    a processor operatively connected to the sensor module, the antenna, and the antenna tuner,
    wherein the processor is configured to:
        determine withdrawal information about a withdrawn degree of the second housing by using the sensor module,
        select an index corresponding to the withdrawal information from among multiple indices in which impedance values of the antenna according to multiple different pieces of withdrawal information are sampled, and
        control, based on a tuning code corresponding to the selected index, the antenna tuner to activate or deactivate at least some among at least one of one or more capacitors or one or more inductors included in the antenna tuner, so as to match the impedance of the antenna.

2. The electronic device of claim 1, further comprising:
    a memory configured to store a first index, which is an impedance value of the antenna corresponding to a first withdrawn length, and a second index, which is an impedance value of the antenna corresponding to a second withdrawn length,
    wherein the processor is further configured to:
        select, when a withdrawn length corresponding to the determined withdrawal information is between the first withdrawn length and the second withdrawn length, an interpolated value obtained by interpolating the first index and the second index as antenna impedance, and
        match the impedance of the antenna, based on a tuning code corresponding to the selected interpolated value.

3. The electronic device of claim 2, wherein the processor is further configured to select the interpolated value by linearly interpolating the first index and the second index, based on a ratio in which the withdrawn length corresponding to the determined withdrawal information internally divides the first withdrawn length and the second withdrawn length.

4. The electronic device of claim 2,
    wherein the memory is further configured to store an impedance graph and values corresponding to the multiple indices on the impedance graph, and
    wherein the processor is further configured to interpolate the first index and the second index, based on the impedance graph.

5. The electronic device of claim 1, wherein the processor is further configured to:
    select, when a withdrawn length corresponding to the determined withdrawal information is between a first withdrawn length and a second withdrawn length, a withdrawn length more approximate to the withdrawn length corresponding to the determined withdrawal information from among the first withdrawn length and the second withdrawn length, and
    select an index corresponding to the selected withdrawn length from among a first index corresponding to the first withdrawn length and a second index corresponding to the second withdrawn length.

6. The electronic device of claim 1, wherein the indices are impedance values of the antenna, which are sampled with regard to multiple withdrawn lengths having different sizes with reference to the withdrawn degree of the second housing.

7. The electronic device of claim 1, wherein the indices are impedance values of the antenna, which are sampled based on a predetermined withdrawn length interval of the second housing.

8. The electronic device of claim 1, wherein each of the multiple indices corresponding to the withdrawal information is an impedance value obtained by linearly interpolating, based on a ratio in which a withdrawn length of the second housing internally divides 0 to 180 degrees, a first reference value, which is an antenna impedance value at the 0 degrees, and a second reference value, which is an antenna impedance value at the 180 degrees.

9. The electronic device of claim 1, further comprising:
    a memory configured to store mapping information in which the withdrawal information, an index corresponding to the withdrawal information, and a tuning code corresponding to the index are mapped,
    wherein the processor is further configured to control the antenna tuner, based on the determined withdrawal information and the mapping information.

10. An electronic device comprising:
    a housing structure comprising a hinge part, a first housing, and a second housing connected to the first housing through the hinge part, the first housing and the second housing being connected to each other so as to be folded or unfolded with reference to the hinge part;
    a sensor module comprising at least one sensor;
    an antenna;
    an antenna tuner electrically connected to the antenna and configured to match impedance of the antenna; and
    a processor operatively connected to the sensor module, the antenna, and the antenna tuner,
    wherein the processor is configured to:
        determine, using the sensor module, folding information about a degree by which the first housing and the second housing are folded,
        select an index corresponding to the folding information from among multiple indices in which impedance values of the antenna according to multiple different pieces of folding information are sampled, and
        control, based on a tuning code corresponding to the selected index, the antenna tuner to activate or deactivate at least some among at least one of one or more capacitors or one or more inductors included in the antenna tuner, so as to match the impedance of the antenna.

11. The electronic device of claim 10, further comprising:
    a memory configured to store mapping information in which a folding angle corresponding to the folding information, an index corresponding to the folding angle, and a tuning code corresponding to the index are mapped, wherein the processor is configured to control the antenna tuner, based on the determined folding information and the mapping information.

12. A method performed by an electronic device comprising a first housing and a second housing connected to the first housing so as to be at least partially insertable into or withdrawable from the first housing, the method comprising:

determining withdrawal information about a withdrawn degree of the second housing;

selecting an index corresponding to the withdrawal information from among multiple indices in which impedance values of an antenna of the electronic device according to multiple different pieces of withdrawal information are sampled; and controlling, based on a tuning code corresponding to the selected index, an antenna tuner to activate or deactivate at least some among at least one of one or more capacitors or one or more inductors included in the antenna tuner, so as to match impedance of the antenna.

13. The method of claim 12, wherein the selecting of the index corresponding to the withdrawal information comprises:

selecting, when a withdrawn length corresponding to the determined withdrawal information is between a first withdrawn length and a second withdrawn length, an interpolated value, obtained by interpolating a first index corresponding to the first withdrawn length and a second index corresponding to the second withdrawn length, as antenna impedance; and selecting an index corresponding to the selected interpolated value.

14. The method of claim 13, wherein the selecting of the interpolated value as antenna impedance comprises selecting the interpolated value by linearly interpolating the first index and the second index, based on a ratio in which the withdrawn length corresponding to the determined withdrawal information internally divides the first withdrawn length and the second withdrawn length.

15. The method of claim 12, wherein the selecting of the indices comprises:

selecting, when a withdrawn length corresponding to the determined withdrawal information is between a first withdrawn length and a second withdrawn length, a withdrawn length more approximate to the withdrawn length corresponding to the determined withdrawal information from among the first withdrawn length and the second withdrawn length; and selecting an index corresponding to the selected withdrawn length from among a first index corresponding to the first withdrawn length and a second index corresponding to the second withdrawn length.

16. The method of claim 12, wherein the indices are impedance values of the antenna, which are sampled with regard to multiple withdrawn lengths having different sizes with reference to the withdrawn degree of the second housing.

17. The method of claim 12, wherein the indices are impedance values of the antenna, which are sampled based on a predetermined withdrawn length interval of the second housing.

18. The method of claim 12, wherein each of the multiple indices corresponding to the withdrawal information is an impedance value obtained by linearly interpolating, based on a ratio in which a withdrawn length of the second housing internally divides 0 to 180 degrees, a first reference value, which is an antenna impedance value at the 0 degrees, and a second reference value, which is an antenna impedance value at the 180 degrees.

19. A method performed by an electronic device comprising a first housing and a second housing connected to each other so as to be folded or unfolded, the method comprising:

determining folding information about a degree by which the first housing and the second housing are folded;

selecting an index corresponding to the folding information from among multiple indices in which impedance values of an antenna of the electronic device are sampled according to multiple different pieces of folding information; and controlling, based on a tuning code corresponding to the selected index, an antenna tuner to activate or deactivate at least some among at least one of one or more capacitors one or more inductors included in the antenna tuner, so as to match impedance of the antenna.

20. The method of claim 19, further comprising:

storing mapping information in which a folding angle corresponding to the folding information, an index corresponding to the folding angle, and a tuning code corresponding to the index are mapped, wherein the controlling of the antenna tuner comprises controlling the antenna tuner, based on the determined folding information and the stored mapping information.

21. The electronic device of claim 1, wherein the antenna comprises a first antenna region disposed in the first housing and a second antenna region disposed in the second housing.

22. The electronic device of claim 10, wherein the antenna comprises a first antenna region disposed in the first housing and a second antenna region disposed in the second housing.

23. The method of claim 12, wherein the antenna comprises a first antenna region disposed in the first housing and a second antenna region disposed in the second housing.

24. The method of claim 19, wherein the antenna comprises a first antenna region disposed in the first housing and a second antenna region disposed in the second housing.

* * * * *